United States Patent
Akiyama et al.

(10) Patent No.: US 10,094,709 B2
(45) Date of Patent: Oct. 9, 2018

(54) LIGHT EMITTING ELEMENT, REFERENCE LIGHT SOURCE AND METHOD FOR OBSERVING LUMINOUS BODY

(71) Applicants: Hidefumi Akiyama, Tokyo (JP); NATIONAL INSTITUTE OF ADVANCED INDUSTRIAL SCIENCE AND TECHNOLOGY, Tokyo (JP); ATTO CORPORATION, Tokyo (JP)

(72) Inventors: Hidefumi Akiyama, Tokyo (JP); Masahiro Yoshita, Tokyo (JP); Yoshihiro Ohmiya, Tsukuba (JP); Hidehiro Kubota, Tokyo (JP); Kaneo Mori, Tokyo (JP); Masahiro Shimogawara, Tokyo (JP)

(73) Assignees: Hidefumi Akiyama, Tokyo (JP); NATIONAL INSTITUTE OF ADVANCED INDUSTRIAL SCIENCE AND TECHNOLOGY, Tokyo (JP); ATTO CORPORATION, Tokyo (JP)

( * ) Notice: Subject to any disclaimer, the term of this patent is extended or adjusted under 35 U.S.C. 154(b) by 109 days.

(21) Appl. No.: 15/108,071

(22) PCT Filed: Dec. 22, 2014

(86) PCT No.: PCT/JP2014/083835
§ 371 (c)(1),
(2) Date: Oct. 3, 2016

(87) PCT Pub. No.: WO2015/098796
PCT Pub. Date: Jul. 2, 2015

(65) Prior Publication Data
US 2017/0191872 A1     Jul. 6, 2017

(30) Foreign Application Priority Data

Dec. 24, 2013  (JP) ................................ 2013-265184
May 1, 2014    (JP) ................................ 2014-094698

(51) Int. Cl.
*H01L 27/00*     (2006.01)
*G01J 1/42*      (2006.01)
(Continued)

(52) U.S. Cl.
CPC ............ *G01J 1/4228* (2013.01); *G01K 13/00* (2013.01); *G02B 5/205* (2013.01); *H01L 27/153* (2013.01);
(Continued)

(58) Field of Classification Search
CPC .......................................................... H01L 33/38
See application file for complete search history.

(56) References Cited

U.S. PATENT DOCUMENTS

2002/0134986 A1* 9/2002 Kamemura ............. H01L 33/46
                                                             257/98
2004/0113096 A1* 6/2004 Tanaami ................... G01J 1/16
                                                            250/458.1
(Continued)

FOREIGN PATENT DOCUMENTS

JP     H03-262931 A     11/1991
JP     2006-276784 A    10/2006
(Continued)

OTHER PUBLICATIONS

Feb. 24, 2015 Search Report issued in International Patent Application No. PCT/JP2014/083835.

*Primary Examiner* — Thanh Luu
(74) *Attorney, Agent, or Firm* — Oliff PLC

(57) ABSTRACT

A light-emitting element, in which a light whose emission angle distribution is one of Lambert's emission law or (Continued)

uniform Isotropic emission, is extracted from a light extraction opening window, and an in-plane distribution of a light intensity on a light extraction surface of the light extraction opening window is uniform, and which can be used as a reference light source when measuring an absolute light quantity of a weak light emitted from a luminous body which is a measurement object.

16 Claims, 25 Drawing Sheets

(51) Int. Cl.
| | |
|---|---|
| *G01K 13/00* | (2006.01) |
| *H05B 33/08* | (2006.01) |
| *G02B 5/20* | (2006.01) |
| *H01L 33/62* | (2010.01) |
| *H01L 33/42* | (2010.01) |
| *H01L 33/44* | (2010.01) |
| *H01L 27/15* | (2006.01) |

(52) U.S. Cl.
CPC .............. *H01L 33/42* (2013.01); *H01L 33/44* (2013.01); *H01L 33/62* (2013.01); *H05B 33/0854* (2013.01); *H05B 33/0863* (2013.01)

(56) References Cited

U.S. PATENT DOCUMENTS

| | | | |
|---|---|---|---|
| 2010/0320908 A1* | 12/2010 | Hsu .................... | H05B 33/0854 315/51 |
| 2011/0169409 A1* | 7/2011 | Stasky ................ | B60Q 1/0483 315/77 |

FOREIGN PATENT DOCUMENTS

| | | |
|---|---|---|
| JP | 4052389 B2 | 2/2008 |
| JP | 2009-287976 A | 12/2009 |
| JP | 2012-211783 A | 11/2012 |
| JP | 2012-238721 A | 12/2012 |
| JP | 2013-532839 A | 8/2013 |

* cited by examiner

FIG. 10A

<FORMULA 2>

$$\eta_L = 2\pi \int_0^\theta \cos\theta \sin\theta d\theta \bigg/ 2\pi \int_0^{\pi/2} \cos\theta \sin\theta d\theta$$
$$= \sin^2\theta$$
$$= NA^2$$

FIG. 10B

<FORMULA 5>

$$\eta_s = \frac{1-\sqrt{1-\sin^2\theta}}{2} = \frac{1-\sqrt{1-NA^2}}{2}$$

| LIGHT QUANTITY VALUE (RATIO TO FULL) | FREQUENCY (Hz) | PULSE WIDTH(μs) (LIGHTING TIME) |
|---|---|---|
| FULL | — | CONTINUATION |
| 1/2 | 14400 | 35.0 |
| 1/4 | 7200 | 35.0 |
| 1/8 | 3600 | 35.0 |
| 1/16 | 1800 | 35.0 |
| 1/32 | 900 | 35.0 |
| 1/64 | 450 | 35.0 |
| 1/128 | 225 | 35.0 |
| 1/256 | 112 | 35.0 |
| 1/512 | 112 | 17.5 |
| 1/1024 | 56 | 17.5 |
| OFF (ZERO) | — | 0 |

| TEMPERATURE (°C) | CORRECTION COEFFICIENT |
|---|---|
| 15 | 0.971 |
| 20 | 0.980 |
| 25 | 0.995 |
| 30 | 1.010 |
| 35 | 1.022 |
| 40 | 1.042 |
| 45 | 1.075 |

LIGHT EMITTING ELEMENT, REFERENCE LIGHT SOURCE AND METHOD FOR OBSERVING LUMINOUS BODY

TECHNICAL FIELD

The present invention relates to a light-emitting element, a reference light source and a method for observing a luminous body.

DESCRIPTION OF RELATED ART

A high-sensitivity measurement for example in a region of a weak light corresponding to femto to milli W, for example a light quantity analysis and an image analysis, etc., are generally performed in the fields such as a material evaluation, medical testing, an environmental monitoring, biological experiments, and chemistry experiments, etc.

SUMMARY OF THE INVENTION

Problem to be Solved by the Invention

In the abovementioned weak light region, it is difficult to accurately evaluate an absolute light quantity of a luminous body which is a measurement object, and it is general to perform evaluation based on a relative light quantity. Further, in the abovementioned weak light region, a measurement result is sometimes greatly affected by a temperature variation of a measurement environment. An object of the present invention is to provide a technique capable of accurately evaluating the absolute light quantity of the luminous body which is the measurement object, in the abovementioned weak light region.

Means for Solving the Problem

According to an aspect of the present invention, there is provided a light-emitting element, wherein a light whose emission angle distribution is one of Lambert's emission distribution (based on Lambert's emission law) or uniform Isotropic emission distribution (uniform Isotropic emission), is extracted from a light extraction opening window, and an in-plane distribution of a light intensity on a light extraction surface of the light extraction opening window is uniform, and which can be used as a reference light source when measuring an absolute light quantity of a weak, light emitted from a luminous body which is a measurement object.

According to another aspect of the present invention, there is provided a reference light source, including:
- a light-emitting element having a characteristic that a brightness of a light-emitting surface is varied according to an operation temperature;
- a light-emitting element drive part configured to drive the light-emitting element;
- a temperature sensor configured to measure a temperature of the light-emitting element; and
- a controller connected to each of the light-emitting element drive part and the temperature sensor,
  wherein based on temperature information received from the temperature sensor, the controller is configured to vary a current value or a voltage value for driving the light-emitting element by the light-emitting element drive part, so as to suppress a variation of the brightness of a light-emitting surface of the light-emitting element caused by a variation of an environmental temperature.

Advantage of the Invention

According to the present invention, even in a weak light region corresponding to femto to milli W, an absolute light quantity of a luminous body which is a measurement objet can be accurately evaluated.

BRIEF DESCRIPTION OF THE DRAWINGS

FIG. 10A is a view showing formula 2 for obtaining a light collection efficiency ($\eta_L$) of an imaging device when an emission angle distribution of a light emitted from the light-emitting element is Lambert's emission law.

FIG. 10B is a view showing formula 5 for obtaining a light collection efficiency ($\eta_S$) of an imaging device when the light is emitted isotropically from the luminous body composed of light emitting molecules in random orientations.

FIG. 13 is a view showing an example of a drive parameter selection table according to the second embodiment.

FIG. 14 is a view showing an example of a correction coefficient selection table according to the second embodiment.

DETAILED DESCRIPTION OF THE INVENTION

First Embodiment

Figure 1A:
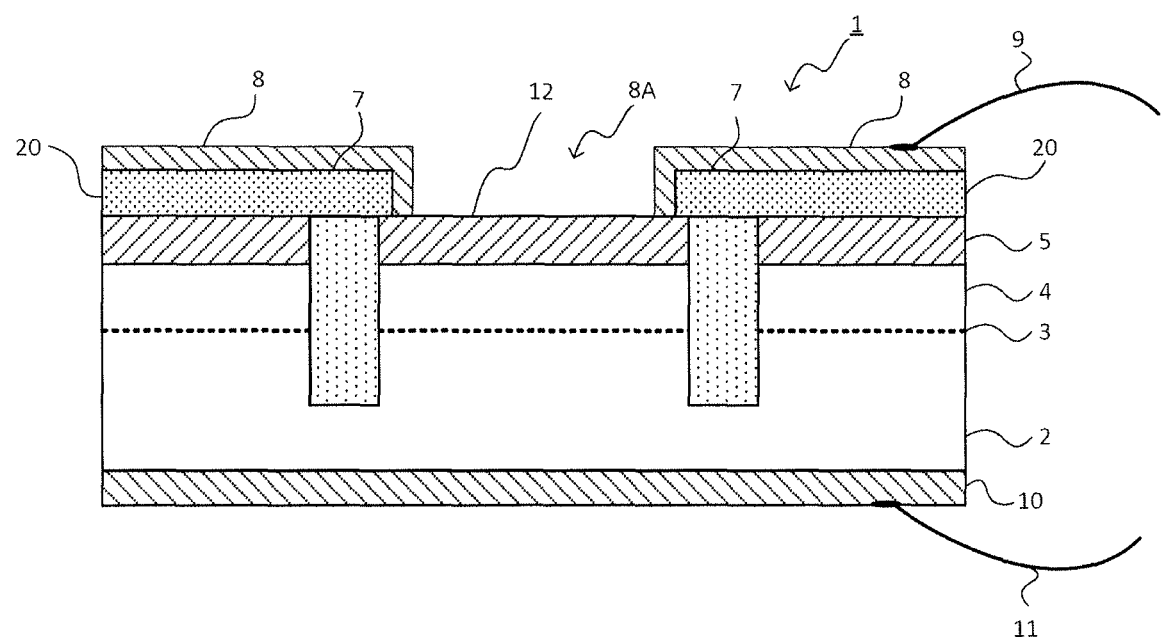
FIG. 1A is a cross-sectional configuration view of a light-emitting element according to a first embodiment.

A first embodiment of the present invention will be described hereafter, with reference to mainly FIG. 1 to FIG. 10B.

(Background of Creation of the Invention)

A high-sensitivity measurement of a weak light or fluorescence, for example, a light quantity analysis and an image analysis, etc., are generally performed in the fields such as a material evaluation, medical testing, an environmental monitoring, biological experiments, and chemistry experiments, etc. In these applications, a light emitted from a luminous body which is a measurement object, has no directivity and which is the light in a weak light region corresponding to femto to milli W. Therefore, it is difficult to measure and evaluate an absolute light quantity of the light emitted from the luminous body in the abovementioned light quantity region. Accordingly, in the abovementioned light quantity region, evaluation is performed for the light quantity emitted from the luminous body using a relative light quantity measured by an arbitrary unit. However, in the evaluation of the light quantity using the relative light quantity (evaluation of the light emitted from the luminous body), measurement results cannot be compared if conditions such as measurement equipment or measurement timing, etc., are different, and an evaluation result cannot be effectively utilized in some cases.

Therefore, for example, there is proposed a method of preparing a solution in which a luminescence standard substance is dissolved (solution of luminescence standard substance), and quantifying the light quantity of a luminous body (luminescence related substance), using the absolute light quantity of the solution of luminescence standard substance as a standard light quantity. That is, there is proposed a method of evaluating (measuring) the absolute light quantity of the luminous body.

However, as described above, in the evaluation of the absolute light quantity of the luminous body using the solution of the luminescence standard substance, the absolute light quantity of the luminous body cannot be accurately evaluated in some cases. Namely, the absolute light quantity is changed only by a slight difference of a temperature, a concentration, and a state of stirring, etc., and it is sometimes difficult to maintain a constant absolute light quantity of the solution of the luminescence standard substance.

As a result of strenuous efforts to solve such a problem, inventors of the present invention achieve a new technique capable of accurately evaluating the absolute light quantity (total luminous flux light quantity) of the luminous body which is the measurement object, in the weak light region corresponding to femto to milli W for example. A structure of the light-emitting element according to an embodiment of the present invention, a method of manufacturing the light-emitting element, and a method of observing the luminous body using the light-emitting element as a reference light source, or the like, will be sequentially described hereafter.

(Structure of a Light-Emitting Element)

As shown in FIG. 1A, a light-emitting element 1 of this embodiment includes a lower clad layer 2, a light-emitting layer (active layer) 3 formed on the lower clad layer 2, an upper clad layer 4 formed on the light-emitting layer 3, and a transparent electrode 5 formed on the upper clad layer 4. The lower clad layer 2 is formed as a n-type compound layer in which impurities (n-type impurities) such as silicon (Si), germanium (Ge), oxygen (O), and selenium (Se), etc., are doped in a semiconductor material such as gallium phosphide (GaP), gallium arsenide (GaAs), gallium nitride (GaN), etc. These semiconductor materials include a mixed crystal of indium (In) or aluminum (Al) at a prescribed composition ratio. The upper clad layer 4 is formed as a p-type compound semiconductor layer in which a similar semiconductor material as the material of the lower clad layer 2 is used, and instead of the n-type impurities used for the lower clad layer 2, the upper clad layer 4 is doped with impurities (p-type impurities) such as magnesium (Mg), zinc (Zn), and carbon (C), etc. The light-emitting layer 3 is formed by a thin film made of a semiconductor material similar to the material of the lower clad layer 2 or the upper clad layer 4, and a material which is undoped or in which a dope concentration (dope density) is set to be lower than the dope concentration of the lower clad layer 2 or the upper clad layer 4. More preferably, the light-emitting layer 3 is formed by a thin film made of a semiconductor material having a small bandgap by increasing In composition ratio or decreasing Al composition ratio or the like, as the semiconductor material. The transparent electrode 5 is formed as a semiconductor layer doped with the p-type impurities at a high concentration or as a transparent conductive film made of indium tin oxide (ITO), etc. A material having a large bandgap for example by more decreasing the In composition ratio or more increasing the Al composition ratio than the light-emitting layer 3 or the upper clad layer 4, is used for the semiconductor layer doped with the p-type impurities at a high concentration. Thus, a light absorption edge of the semiconductor layer is positioned at a shorter wavelength side, and therefore the semiconductor layer has a higher transparency.

In the light-emitting element 1, a groove (recess portion) 6 (see FIG. 2) is formed at a depth that reaches at least the light-emitting layer 3, and preferably the lower clad layer 2, from a surface side of the transparent electrode 5. An inside of the groove 6 is embedded with an insulator 7 without clearance, the insulator 7 being made of an organic-based insulating material such as benzyl cyclo butene (BCB), polyethylene, epoxy resin, and polyimide, etc., or an inorganic-based insulating material such as $SiO_2$ or SiN, etc. A lower edge of the insulator 7 reaches at least the light-emitting layer 3, and preferably reaches the lower clad layer 2. The shape of the groove 6, namely, the shape of the insulator 7 is a cylindrical shape with a cross-sectional surface formed into a circular shape. By providing the cylindrical insulator 7, a current that flows through the light-emitting element 1 flows only a region surrounded by the cylindrical insulator 7, and a light emission is generated only in the region surrounded by the cylindrical insulator 7. Namely, the cylindrical insulator 7 functions as a current confinement portion (current blocking portion) for suppressing a dispersion of the current that flows through the light-emitting element 1 and restricting its flow path.

A surface electrode 8 is formed on the transparent electrode 5. An opening 8A is formed in the surface electrode 8 by exposing the surface of the transparent electrode (a disc-shaped transparent electrode) 5 surrounded by the insulator 7 as a light extraction surface 12 described later, thus extracting a light emitted from the light extraction surface 12. Namely, the surface electrode 8 is formed in a region other than the region constituting the light extraction surface 12 described later. The surface electrode 8 is formed so as to cover an entire circumference of an outer circumferential edge of the transparent electrode (disc-shaped transparent electrode) 5 surrounded by the insulator 7. Specifically, the surface electrode 8 is configured to cover the entire circumference of the outer circumferential edge of the disc-shaped transparent electrode 5 with a prescribed width, that is, continuously cover this portion without interruption. Further, the surface electrode 8 is formed so as to cover the surface of the transparent electrode 5 that is positioned in an outside region of the insulator 7. Namely, the surface electrode 8 is configured to function as a light shielding film for preventing a leak of light from the region other than the light extraction surface 12 described later. The surface electrode 8 is configured to be connected to the transparent electrode 5 inside of the insulator 7, and not electrically connected to the transparent electrode 5 outside of the insulator 7. The surface electrode 8 is composed of a metal film which is made of a metal material containing Au, Ag, and Al, etc. A bonding wire (positive side wiring) 9 is connected to the surface electrode 8 for applying a voltage to the surface electrode 8.

An insulating layer 20 made of an insulating material such as $SiO_2$ or SiN, etc., is formed between the transparent electrode 5 positioned outside region of the insulator 7 and the surface electrode 8. Thus, it becomes possible to avoid a current injection to the outside region of the insulator 7 by electrical insulating between the transparent electrode 5 positioned in the outside region of the insulator 7 and the surface electrode 8. The insulating layer 20 is preferably formed so as to cover the insulator 7. Namely, an upper surface of the insulating layer 20 is preferably formed flat. Thus, the surface electrode 8 can be more accurately formed. Further, the insulating layer 20 may be provided so as to cover the entire circumference of the outer circumferential edge of an inside of the insulator 7, with a prescribed width.

A back electrode 10 is provided on a backside of the lower clad layer 2. The back electrode 10 is made of a metal material containing Au, Ag, and Al, etc., for example. A bonding wire (negative side wiring) 11 is connected to the back electrode 10, for applying a voltage to the back electrode 10.

Figure 1B:
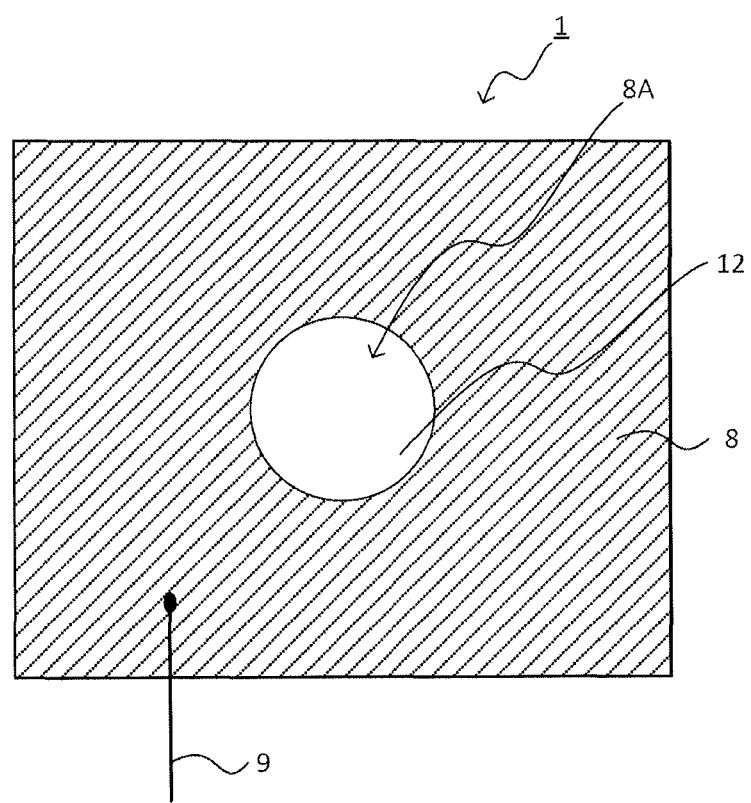
FIG. 1B is a planar configuration view of the light-emitting element shown in FIG. 1A.

As shown in FIG. 1B, only the vicinity of the outer circumferential edge of the surface of the disc-shaped transparent electrode 5 surrounded by the insulator 7, is covered with the surface electrode 8, and a circular region inside thereof is exposed. Namely, the surface of the disc-shaped transparent electrode 5 is exposed from the opening 8A of the surface electrode 8. An exposed surface (opening surface) of the transparent electrode 5 functions as the light extraction surface 12 for extracting the light emitted from the light-emitting layer 3 by injecting the current between the surface electrode 8 and the back electrode 10. Namely, the exposed surface of the transparent electrode 5 becomes a light-emitting surface of the light-emitting element 1. At this time, the opening 8A of the surface electrode 8 functions as a light extraction opening window for extracting the light emitted from the light-emitting layer 3. The light extraction surface 12, namely, the exposed surface of the transparent electrode 5 is preferably formed flat. The circular transparent electrode 5 constituting the light extraction surface 12 is configured to cover the entire surface of the upper clad layer 4 which is supposed to be a base, so as not to be exposed.

The material, the thickness, and the impurity concentration, etc., of the lower clad layer 2, the light-emitting layer 3, the upper clad layer 4, the transparent electrode 5, the insulator 7, the surface electrode 8, and the back electrode 10 constituting the light-emitting element 1, are suitably determined based on a specification of the light-emitting element 1, for example based on a wavelength or a light quantity, etc. An inner diameter, an outer diameter, the material of the insulator 7, and a width, etc., of the surface electrode 8 that covers the outer circumferential edge of the transparent electrode 5, are similarly suitably determined based on the specification of the light-emitting element 1. The shape and inner diameter, etc., of the light extraction surface 12 (opening 8A which is the light extraction opening window) are suitably determined according to the shape and a dimension of the luminous body which is a measurement object in an observation method described later. As the shape of the light extraction surface 12 (light extraction opening window), for example a circular shape having a diameter of 1 μm to 5 mm, preferably 3 m to 3 mm, and more preferably 10 μm to 2 mm can be given for example.

(Method for Manufacturing the Light-Emitting Element)

Figure 2:
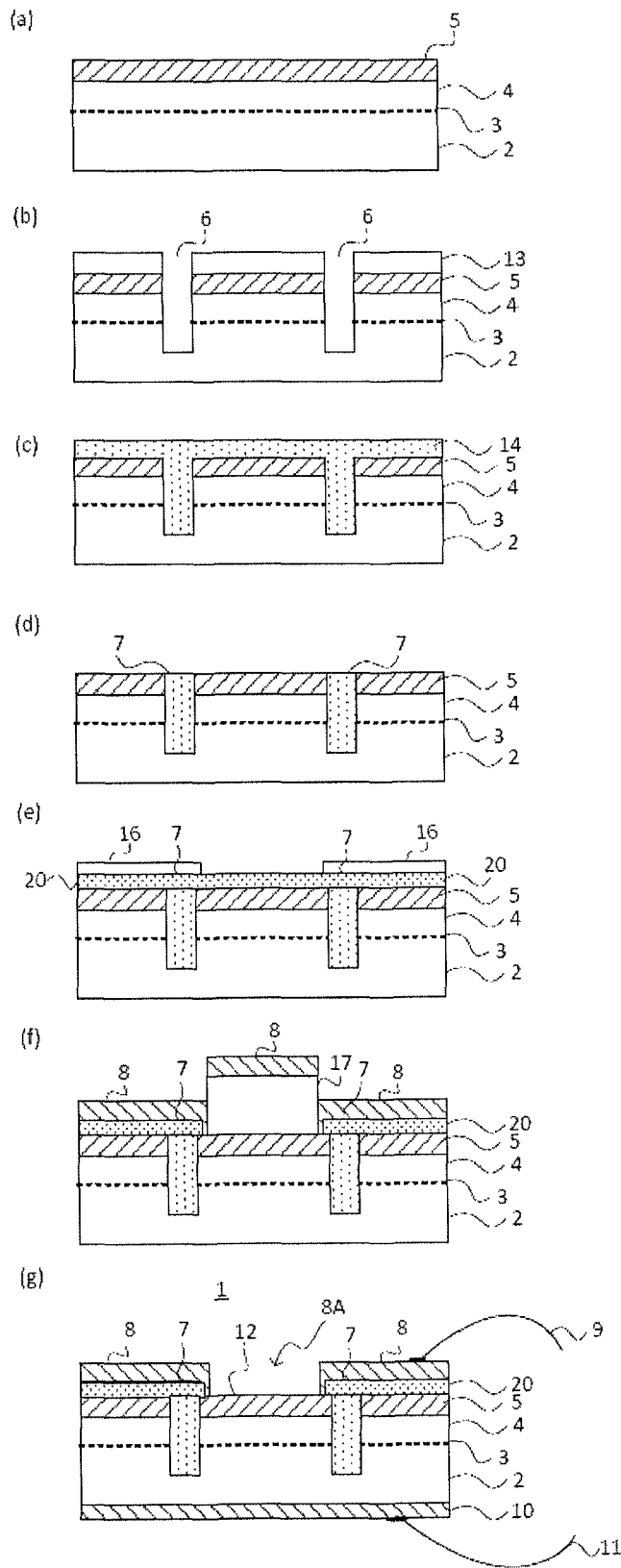
FIG. 2 is a flowchart showing the manufacturing steps of the light-emitting element shown in FIG. 1A and FIG. 1B.

A method for manufacturing the light-emitting element 1 of this embodiment will be described next, using FIG. 2.

For example, as shown in FIG. 2(a), the lower clad layer 2 is formed on the n+type GaAs wafer as a substrate, and the light-emitting layer 3 is formed on the lower clad layer 2, and the upper clad layer 4 is formed on the light-emitting layer 3. Then, the transparent electrode 5 is formed on the upper clad layer 4.

As shown in FIG. 2(b), a resist layer 13 having a prescribed pattern (for example a cross-sectional surface has an annular pattern) is formed on the transparent electrode 5. The groove (recess portion) 6 is formed at a depth that reaches at least the light-emitting layer 3, and preferably the lower clad layer 2, by etching, etc., using the resist layer 13 as a mask. After the groove 6 is formed, the resist layer 13 is removed.

As shown in FIG. 2(c), the insulating film 14 constituting the insulator 7 is formed so as to embed the inside of the groove 6 without clearance and cover the surface of the transparent electrode 5. Then, as shown in FIG. 2(d), the insulating film 14 positioned above the transparent electrode 5 is removed by etching. Namely, the insulating film 14 is removed so that the upper surface of the insulator 7 whose cross-sectional surface has an annular cylindrical shape, is flat at the same height as the upper surface of the transparent electrode 5.

As shown in FIG. 2(e), the insulating layer 20 is formed on the upper surface of the transparent electrode 5 and the upper surface of the insulator 7. Subsequently, the resist layer 16 having a prescribed pattern is formed on the insulating layer 20. A prescribed part of the insulating layer 20 is removed by etching, etc., with the resist layer 16 as a mask, to form the insulating layer 20 that covers the outside region of the insulator 7 and the entire circumference of the outer circumferential edge of the inside of the insulator 7 with a prescribed width. Thereafter, the resist layer 16 is removed.

As shown in FIG. 2(f), a resist layer 17 having a prescribed pattern is formed on the transparent electrode 5 surrounded by the insulator 7 (insulating layer 20 that covers the entire circumference of the outer circumferential edge of the inside of the insulator 7). A metal vapor deposition and a lift-off are performed using the resist layer 17 as a mask, to thereby form the surface electrode 8. Namely, the surface electrode 8 is formed so as to cover the entire circumference of the outer circumferential edge of the disc-shaped transparent electrode 5 (insulating layer 20 that covers the entire circumference of the outer circumferential edge of the inside of the insulator 7, with a prescribed width) with a prescribed width, and cover the outside region of the insulator 7. After the surface electrode 8 is formed, the resist layer 17 is removed. Thus, the opening 8A as the light extraction opening window is formed in the surface electrode 8, and the surface of the disc-shaped transparent electrode 5 surrounded by the insulator 7 is exposed to become the light extraction surface 12.

As shown in FIG. 2(g), the back electrode 10 is formed on the backside of the lower clad layer 2. Preferably, the back electrode 10 is formed on the backside of the lower clad layer 2, and only in a region opposed to the disc-shaped transparent electrode 5 surrounded by the insulator 7, that is, only in a region opposed to the light extraction surface 12.

Then, the bonding wire 9 is connected to the surface electrode 8, and the bonding wire 11 is connected to the back electrode 10. Thus, the light-emitting element 1 of this embodiment is manufactured, and the manufacturing step is ended.

(Method for Observing a Luminous Body)

A method for observing a luminous body using the abovementioned light-emitting element 1 as a reference light source, will be described next.

[Acquisition of a Total Luminous Flux Light Quantity of the Light-Emitting Element]

First, an absolute light quantity of the light extracted when activating (causing light emission of) the light-emitting element 1, is acquired. Specifically, when the light-emitting element 1 is activated, a total luminous flux light quantity ($A_{LU}$) of the light extracted from the opening 8A as the light extraction opening window having a known size, is measured for example using an integrating sphere method.

[Acquisition of an Emission Angle Distribution of the Light Emitted from the Light-Emitting Element]

An emission angle distribution of the light extracted when activating the light-emitting element 1, is acquired. First, for example a photodiode is used as a photodetector, and the light-emitting element 1 is disposed so that the light extraction surface 12 which is the light-emitting surface of the light-emitting element 1 is opposed to the photodiode. Then, by activating the light-emitting element 1, a relative angle of the light-emitting surface of the light-emitting element 1 with respect to the photodiode is changed, to thereby measure the emission angle distribution of the light emitted from the light-emitting element 1. For example, the light quantity is measured by variously changing the angle of the light-emitting element 1, namely, variously changing the angle of the light extraction surface 12 with respect to the photodiode, so that the emission angle distribution of the light emitted from the light-emitting element 1 is measured.

[Calibration of the Imaging Device]

Subsequently, calibration (validation) of the imaging device is performed, which is used for measuring the absolute light quantity of the light emitted from the luminous body which is a measurement object.

First, the light-emitting element 1 is set in the imaging device (for example, high sensitivity CCD or CMOS camera, etc.) so as to photograph the light extraction surface 12 (light extraction opening window) of the light-emitting element 1 whose the total luminous flux light quantity ($A_{LU}$) and emission angle distribution are already acquired. Then, by activating light-emitting element 1, the light extraction surface 12 (light extraction opening window) is photographed from above the light extraction opening window, using the imaging device.

Next, light collection efficiency ($\eta_L$) of the imaging device is defined. The light collection efficiency ($\eta_L$) of the imaging device is the ratio of the absolute light quantity ($P_{LU}$) of the light-emitting element 1, with respect to the total luminous flux light quantity ($A_{LU}$) of the light emitted from the light extraction surface 12 of the light-emitting element 1. The absolute light quantity ($P_{LU}$) of the light-emitting element 1 refers to the absolute light quantity ($P_{LU}$) of the light-emitting element 1 photographed by the imaging device, or the absolute light quantity ($P_{LU}$) of the light-emitting element 1 passing through a diaphragm (iris) mechanism included in the imaging device and photographed by the imaging device. Namely, the light collection efficiency ($\eta_L$) of the imaging device is defined by the following (Formula 1).

Light collection efficiency ($\eta_L$) of the imaging device=Absolute light quantity ($P_{LU}$) of the light-emitting element 1/Total luminous flux light quantity ($A_{LU}$)  (Formula 1)

The light collection efficiency ($\eta_L$) of the imaging device can be calculated by integrating the measured emission angle distribution by a solid angle, according to a numerical aperture (NA) of the lens included in the imaging device and used for photographing. For example, when the emission angle distribution of the light emitted from the light-emitting element 1 is a Lambert's emission law, the light collection efficiency ($\eta_L$) of the imaging device can be analytically calculated from (Formula 2) shown in FIG. 10A.

From the abovementioned (Formula 1) and (Formula 2), the absolute light quantity ($P_{LU}$) of the light-emitting element 1 incident on the imaging device through the iris mechanism and photographed by the imaging device, can be calculated from the total luminous flux light quantity ($A_{LU}$) and the numerical aperture (NA) as shown in the following (Formula 3).

Absolute light quantity ($P_{LU}$) of the light-emitting element 1=Total luminous flux light quantity ($A_{LU}$)×Light collection efficiency ($\eta_L$) of the imaging device =Total luminous flux light quantity ($A_{LU}$)×NA$^2$  (Formula 3)

Then, the absolute sensitivity (S) of the imaging device (W/unit luminance) is acquired. The imaging device includes an analogue digital converter having a prescribed resolution. The imaging device is configured to digitize a signal for each pixel using the analogue digital converter, the signal being obtained by incident of the light, and output a brightness image as a photographed image. A numerical value digitized for each pixel is called a luminance value. Then, the sum of luminance values ($I_L$) of the image (brightness image) of the light extraction surface 12 of the light-emitting element 1 outputted from the imaging device, is acquired.

Then, the absolute sensitivity (S) of the imaging device is calculated. As shown in the following (Formula 4), the absolute sensitivity (S) of the imaging device can be calculated from the absolute light quantity ($P_{LU}$) of the light-emitting element 1 calculated by (Formula 3), and the sum of the luminance values ($I_L$) of the image of the light extraction surface 12.

Absolute sensitivity (S)=Absolute light quantity ($P_{LU}$) of the light-emitting element 1/Sum of the luminance values ($I_L$) of the image of the light extraction surface 12  (Formula 4)

[Measurement of the Total Luminous Flux Light Quantity of the Luminous Body]

Subsequently, using the calibrated imaging device, the light-emitting surface of the luminous body which is a measurement object (observation object) is photographed, and the absolute light quantity of the weak light emitted from the luminous body is measured. Specifically, first, the luminous body is set so that the light-emitting surface of the luminous body can be photographed, using the imaging device subjected to the calibration as described above, namely using the imaging device that acquires the absolute sensitivity (S). Then, the light-emitting surface of the luminous body is photographed using the imaging device. Then, the sum of the luminance values (Is) of the light-emitting surface of the luminous body is acquired from the photographed image of the light-emitting surface of the luminous body.

When the light from the luminous body composed of light emitting molecules in random orientations is emitted isotropically, the light collection efficiency ($\eta_S$) of the imaging device is calculated from (Formula 5) shown in FIG. 10B. If the light from the luminous body is not necessarily emitted isotropically, the light collection efficiency ($\eta_S$) of the imaging device may be determined in a similar manner to a case of acquiring the emission angle distribution of the light emitted from the light-emitting element 1. For example, it is acceptable that the angle of the luminous body is variously changed, the numerical aperture (NA) of the lens included in the imaging device is changed, the sum of the luminance values ($I_S$) of the light-emitting surface of the luminous body is measured, the emission angle distribution of the light emitted from the luminous body is evaluated, and the light collection efficiency ($\eta_S$) of the imaging device is experimentally determined.

Then, the total luminous flux light quantity ($A_S$) of the luminous body is calculated. The total luminous flux light quantity ($A_S$) of the luminous body can be calculated by the following (Formula 6).

Total luminous flux light quantity ($As$) of the luminous body=Sum of luminance values ($I_S$)×Absolute sensitivity ($S$)/Light collection efficiency ($\eta_S$) of the imaging device (Formula 6)

When the light-emitting element 1 is activated, ON/OFF pulse ratio (duty ratio) of the current flowed between the surface electrode 8 and the back electrode 10 (amount of the current injected to the light-emitting element 1), and a lighting cycle are preferably adjusted, so that the brightness (light quantity) of the light extraction surface 12 of the light-emitting element 1 corresponds to the light quantity suitable for the sensitivity of the imaging device. In the abovementioned light-emitting element 1, a relation between the ON/OFF pulse ratio of the injected current amount and the light quantity extracted from the light-emitting element 1, is linear for example when the light quantity extracted from the light-emitting element 1 is between 0.02 mW and 500 fW. Then, by changing the lighting cycle, a quantitatively variable light quantity is realized in a wide range. Accordingly, it becomes possible to acquire the absolute sensitivity (S) of the photodiode (PD) suitable for measuring a relatively large light quantity, the imaging device suitable for measuring the weak light corresponding to about femto to pico W, and further a photodetector, etc., such as a photomultiplier tube (PMT) for example. Namely, it becomes possible to accurately calibrate the PD, the imaging device suitable for measuring the weak light or PMT. As a result, even if the light emitted from the luminous body is the weak light corresponding to about femto to pico W, the total luminous flux light quantity (As) of the luminous body can be acquired.

Further, the emission wavelength of the light-emitting element 1 is preferably the same as the wavelength of the luminous body. However, even in a case that there is a great difference between the emission wavelength of the light-emitting element 1 and the wavelength of the luminous body, it is possible to acquire the absolute sensitivity (S) of the imaging device and acquire the total luminous flux light quantity (As) of the luminous body. Namely, when the wavelength of the luminous body is greatly different from the emission wavelength of the light-emitting element 1, first, a relative wavelength sensitive characteristic of the imaging device is measured. Then, the absolute sensitivity (S) of the imaging device is obtained for each wavelength, from the absolute sensitivity (S) and the relative wavelength sensitivity characteristic acquired using the light-emitting element 1 as a reference light source, thereby making it possible to acquire the total luminous flux light quantity (As) of the luminous body.

Further, when the light extraction opening window of the light-emitting element 1, namely the opening 8A formed on the surface electrode 8 has high accuracy of dimension, the light-emitting element 1 that emits light uniformly in-plane of the light extraction surface 12 can be used as a scale, by comparing the image obtained by photographing the light extraction surface 12 and the image obtained by photographing the light-emitting surface of the luminous body. Thus, it becomes possible to accurately confirm the dimension, shape, and area, etc., of the light-emitting surface of the luminous body.

According to this embodiment, one or a plurality of effects shown below can be exhibited.

(a) By changing the current amount injected to the light-emitting element 1, a luminescence amount can be freely adjusted. For example, due to a linear relation between ON/OFF pulse ratio (duty ratio) of the amount of the current injected to the light-emitting element 1 and the light quantity, the luminescence amount can be accurately controlled. For example, by adjusting the ON/OFF pulse ratio of the injected current amount and the lighting cycle, the luminescence amount of the light-emitting element 1 can be accurately controlled in the light quantity suitable for the sensitivity of the imaging device. Accordingly, it becomes possible to acquire the absolute sensitivity (S) of the PD (photodiode) suitable for measuring a relatively large light quantity, the imaging device suitable for measuring the weak light corresponding to about femto to pico W, and further the photodetector, etc., such as a photomultiplier tube (PMT) for example. Namely, it becomes possible to accurately calibrate the PD, the imaging device suitable for measuring the weak light, and PMT. As a result, even if the light emitted from the luminous body is the weak light corresponding to about femto to pico W, the total luminous flux light quantity (As) of the luminous body can be acquired. Further, since the luminescence amount can be freely adjusted by the injected current amount, there is no necessity for providing a neutral density filter on an upper side of the light extraction surface 12. Further, an additional calibration work by providing the neutral density filter can be eliminated.

(b) By providing the cylindrical insulator 7 at the depth that reaches at least the light-emitting layer 3 from the surface side of the transparent electrode 5, the insulator 7 can function as a current confinement portion (current blocking portion). This makes it possible to not only perform current injection (carrier injection) efficiently to an inside region of the insulator 7, but also prevent carrier injection to an outside region of the insulator 7. As a result, it becomes possible to prevent light emission in the outside region of the insulator 7. Namely, the light-emitting element 1 can extract the light only from the opening 8A as the light extraction opening window.

Particularly, by providing the insulator 7 under the light-emitting layer 3, namely, at the depth that reaches the lower clad layer 2, it becomes possible to more prevent the injection of the carrier to the outside region of the insulator 7. Namely, the light emission in the outside region of the insulator 7 can be more surely prevented.

(c) By covering (without clearance) the entire circumference of the outer circumferential edge of the transparent electrode 5 surrounded by the insulator 7 by the surface electrode 8, a local electric field concentration in the light extraction surface 12 hardly occurs when a voltage is applied to the surface electrode 8. Namely, the current density that flows through the region surrounded by the insulator 7 can be uniform in its plane. As a result, the in-plane distribution of a light intensity in the light extraction surface 12 can be made uniform. Further, the light emission angle distribution of the light extracted from the light emitted from the light extraction surface 12 and extracted from extraction opening window, can be made smooth and simple. For example, the light emission angle distribution can be the Lambert's emission law or can be the uniform Isotropic emission. When the light emission angle distribution is the Lambert's emission law, this shows that the light emission angle distribution completely coincides the Lambert's emission law, namely coincides cos θ, and also shows an approximate Lambert's emission law in which emission intensity is strongest in θ=0° direction, and the emission intensity is gradually decreased with an increase of θ, and become zero in θ=90° direction. In this case, the light collection efficiency ($\eta_L$) of the imaging device in the above (Formula 2) is obtained by numerically integrating an actually measured angle distribution. The same applies to the uniform Isotropic emission.

Particularly, when the light extraction surface 12 has a circular shape as shown in this embodiment, the local electric field concentration in the light extraction surface 12 more hardly occurs at the time of applying the voltage to the surface electrode 8. Namely, the current density that flows through the region surrounded by the insulator 7 can be made further uniform in the plane. As a result, the in-plane distribution of the light intensity of the light extraction surface can be made further uniform.

Figure 9A:
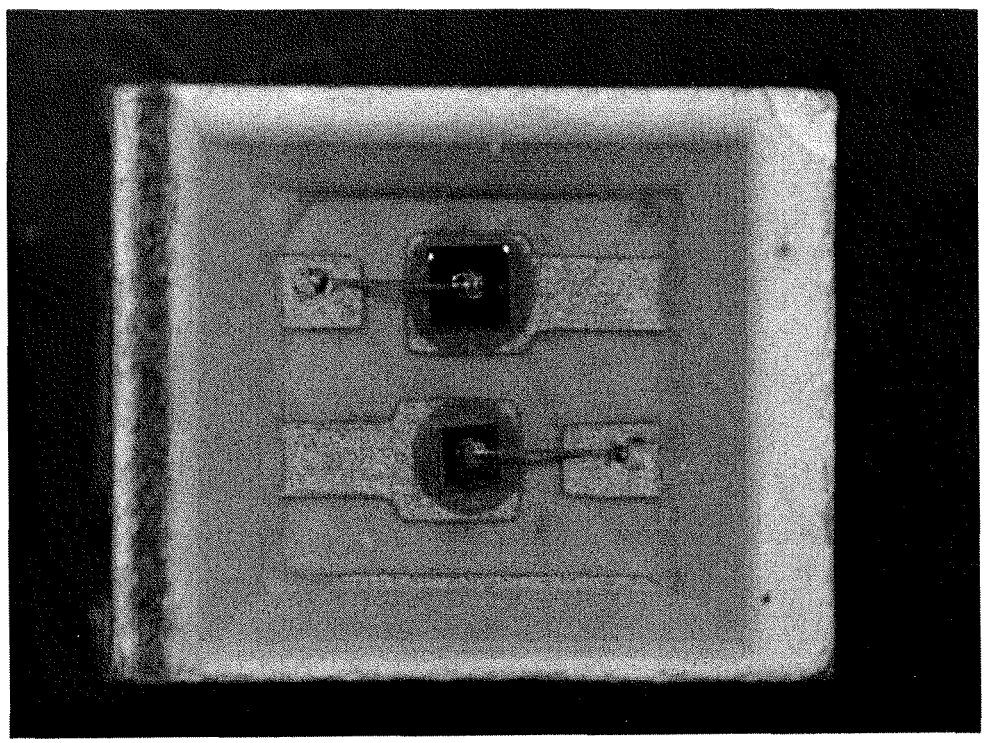
FIG. 9A is an expanded photograph of a light-emitting surface of a general LED element.
Figure 9B:
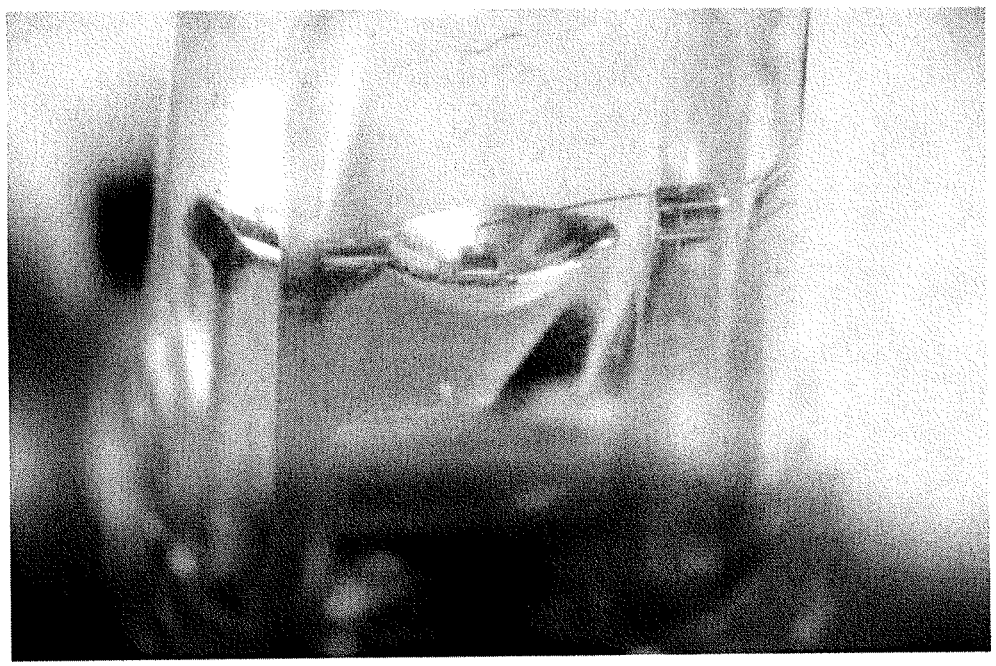
FIG. 9B is an expanded photograph of the light-emitting surface of the general LED element.

(d) Since the surface electrode 8 is provided so as to cover the outer circumferential edge of the light extraction surface 12, the light emitted from the light extraction surface 12 is not shielded by a member such as the surface electrode 8 and the bonding wire 9, etc. Meanwhile, when normal LED as shown in FIG. 9A and FIG. 9B for example is used as the light-emitting element, a shadow of the bonding wire 9 is formed or the emitted light is scattered, resulting in damaging the accuracy of the measurement when the light extraction surface 12 is photographed.

(e) By providing the surface electrode 8 so as to cover the outside region of the insulator 7 on the main surface of the light-emitting element 1 at the side where the light extraction surface 12 is formed, the surface electrode 8 functions as a light shielding film. Thus, the leak of the light from the region other than the light extraction surface 12 can be surely prevented. Also, by making the surface electrode 8 function as the light shielding film, the configuration of the light-emitting element 1 can be simplified, and as a result, a manufacturing cost can be reduced.

(f) The light extraction surface 12, namely the transparent electrode 5 provided in the inside of the insulator 7, is configured so as to cover the entire surface of the upper clad layer 4 without being exposed. Thus, the in-plane distribution of the light intensity on the light extraction surface 12 can be made uniform. Namely, the light emitted from the light-emitting layer 3 is entirely extracted after passing through both of the upper clad layer 4 and the transparent electrode 5, and therefore the light extraction efficiency can be made uniform in the plane, and the in-plane distribution of the light intensity can be made uniform. As a result, when the light extraction surface 12 is photographed from above, it is possible to suppress the generation of unevenness in the in-plane brightness.

When the transparent electrode 5 is provided on the light extraction surface 12 in line-and-space shape, a lattice shape, or an island shape, etc., namely, when the transparent electrode 5 is provided in a shape of covering only a part of the surface of the upper clad layer 4 and exposing the other part, there is a coexistence state of the lights between the light extracted after passing through both of the upper clad layer 4 and the transparent electrode 5, and the light extracted after passing through only the upper clad layer 4. As a result, the in-plane distribution of the light intensity on the light extraction surface 12 becomes non-uniform, and when the light extraction surface 12 is photographed from above, the local unevenness occurs in the in-plane brightness.

(g) By acquiring the sum of the luminance values ($I_L$) of the image of the light extraction surface 12 of the light-emitting element 1 of this embodiment and performing calibration of the imaging device, the total luminous flux light quantity (As) of the luminous body which is the measurement object emitting the weak light (for example, the light corresponding to femto to milli W) can be accurately acquired. Further, by comparing the sizes of the images obtained by photographing the luminous body which is the measurement object and the light extraction surface 12 of the light-emitting element 1 of this embodiment, a dimension of the light-emitting surface of the luminous body which is the measurement object, can be accurately acquired. Namely, the light-emitting element 1 of this embodiment can be suitably used as the reference light source (reference light source when compared with the measurement object) when performing high sensitivity measurement of the weak light emission or fluorescence.

(h) The light-emitting element 1 of this embodiment is particularly effective when performing high sensitivity measurement of the weak light emission or fluorescence in the field of the material evaluation, medical testing, environmental monitoring, and biological experiments, etc.

Because a white light source (simply called a white light source) such as a halogen lamp, etc., generally used as the reference light source, has the light quantity corresponding to 10 to 500 W which is relatively large, and therefore is not suitable as the reference light source for measuring the weak light.

The abovementioned problem is solved by combining the white light source and the neutral density filter or reducing the sensitivity of the measurement device, and it is conceivable to employ a technique of using the white light source as the reference light source for measuring the weak light. However, in these cases, there is a necessity for performing calibration work based on an attenuation rate of the neutral density filter or the sensitivity of the measurement device, and this work is significantly complicated. Further, equipment used for the calibration work or a working method is not standardized. When there are various calibration equipment or methods depending on a working environment or workers, there is no guarantee in the calibration accuracy, thus lacking in reliability as the reference light source. Further, when the neutral density filter is provided, it is necessary to take measures to block the light from entering from the periphery of the neutral density filter.

Further, it is also conceivable to use a general LED element (simply called a LED element) as the reference light source for measuring the weak light by driving the LED element while adjusting ON/OFF pulse ratio (by setting the ON/OFF pulse ratio to be small). However, as shown in FIG. 9A, a bonding wire 9 or an electrode, etc., are provided in the general LED element, and when the light-emitting surface is photographed, shadows of members or scattered lights are also photographed together. Further, as shown in FIG. 9B, the general LED element includes various optical components such as a light emitting plate, a reflection plate, and a lens, etc., and an in-plane distribution of the light intensity and an emission angle distribution in the light-emitting surface are significantly complicated (in-plane non-uniformity). Therefore, even if the LED element can be operated as a weak light source, it is unsuitable as the reference light source for measuring the weak light.

Meanwhile, the light-emitting element 1 of this embodiment has not only the capability of adjusting the light luminescence amount to the light quantity suitable for the sensitivity of the imaging device as described (a), but also the excellent characteristics as described in (b) to (f). Therefore, the light-emitting element 1 of this embodiment can be suitably used as the reference light source when performing high sensitivity measurement of the weak light emission or fluorescence.

Modified Embodiment

The abovementioned embodiment can be variously modified in a range not departing from the gist of the invention.

For example, the shape of the opening 8A (light extraction opening window) formed on the surface electrode 8, namely, the shape of the light extraction surface 12 is not limited to the circular shape. An elliptical shape, an oval shape, or a rounded corner shape may be acceptable, and further a polygonal shape such as a rectangular shape (rectangle), a triangle shape, or a square shape may be acceptable. Further, the shape may be a combination of them. However, it is easier to obtain the abovementioned effect of (c) in the case of the circular shape, the elliptical shape, the oval shape, and the rounded corner shape, and this is preferable.

Not only one light extraction surface 12 (opening 8A) but also a plurality of them may be provided. For example, by arranging the light extraction surfaces 12 on the same surface in a dot matrix form or in a line, in-plane sensitivity unevenness or image distortion, etc., can be evaluated in the imaging device using an image detection element such as CCD or CMOS, etc. Further, even in a case of arranging a plurality of light-emitting elements 1 having a single light extraction surface 12 in the dot matrix form, and using the plurality of light-emitting elements 1 as one light source, a similar effect can be obtained.

The back electrode 10 is not limited to the case that it is provided on the backside of the lower clad layer 2. For example, the surface and the side surface of the lower clad layer 2 may be exposed, and a metal electrode provided on these surfaces may be used as the back electrode 10.

An outside portion of the cylindrical insulator 7, namely, the transparent electrode 5, the upper clad layer 4, the light-emitting layer 3, and the lower clad layer 2 positioned outside of the cylindrical insulator 7, may be removed by etching, etc.

When the cylindrical insulator 7 is formed, a protective film (passivation film) such as SiN film, etc., for example, may be provided as a base. Namely, the cylindrical insulator 7 may be protected by the passivation film. Specifically, the passivation film as the protective film may be provided on the entire surface of the cylindrical insulator 7. The protective film is preferably made of a material having a low light transmission. Thus, the abovementioned effect (b) can be easily obtained and this is preferable.

The cylindrical insulator 7 may be made of a material (for example, the material having black color) having a light-shielding property (low light transmission). Thus, the cylindrical insulator 7 also functions as a light shielding part (light absorption part) for preventing a leak of light from a region other than the opening 8A (namely the region other than the light extraction surface 12), the light being emitted from the region surrounded by the insulator 7. As a result, the abovementioned effect (b) can be easily obtained and this is preferable.

Figure 3A:
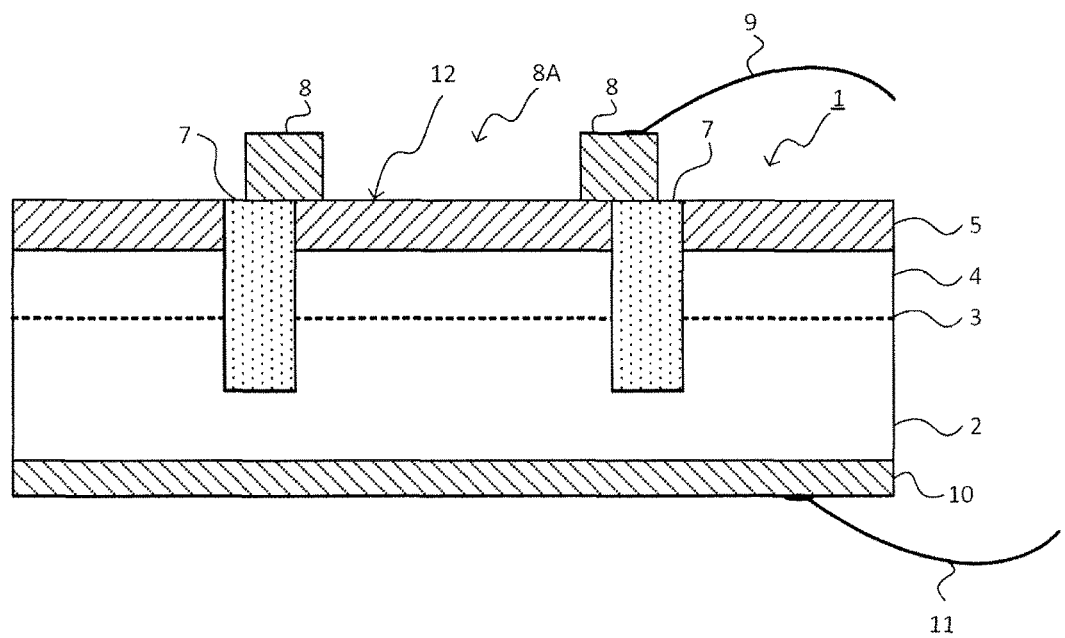
FIG. 3A is a cross-sectional configuration view showing a modified example of the light-emitting element according to the first embodiment.
Figure 3B:
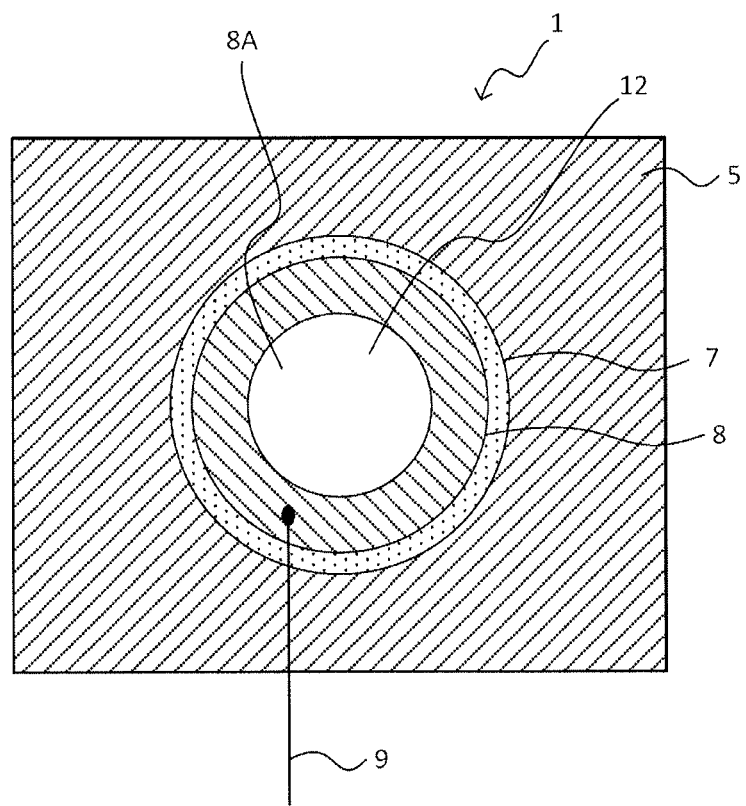
FIG. 3B is a planar configuration view of the light-emitting element shown in FIG. 3A.

The configuration is not limited to a case of covering the outside region of the insulator 7 by the surface electrode 8. For example, the surface electrode 8 may be formed only on the outer circumferential edge of the transparent electrode 5 surrounded by the insulator 7, and a light shielding film which is a separate body from the surface electrode 8, may be provided in the outside region of the transparent electrode 5. The light shielding film may be formed by the metal film or may be formed by a non-metal film. Further, when the insulator 7 has the light shielding property, for example as shown in FIG. 3A and FIG. 3B, the light shielding film is not required to be provided in the outside region of the transparent electrode 5. Even in a case of the light-emitting element 1 as shown in FIG. 3A and FIG. 3B, it can be suitably used as the reference light source when performing the high sensitivity measurement of the weak light or fluorescence for example. When the light shielding film is not formed by the metal film, or the light shielding film is not provided, the insulating layer 20 is not required to be provided.

The light-emitting layer 3 is not limited to a case of having a thin film made of a single material, namely having a bulk structure. For example, the light-emitting layer 3 may have a single or multiple quantum well structure formed by laminating a well layer and a barrier layer alternately. The well layer can be formed as a compound semiconductor layer made of InGaAs or InGaN, etc. The barrier layer can be formed as a compound semiconductor layer made of AlGaAs or GaN, etc.

The present invention is not limited to a case that the lower clad layer 2 is formed as the n-type compound semiconductor layer, and the upper clad layer 4 is formed as the p-type compound semiconductor layer. Namely, it is also acceptable that the lower clad layer 2 is formed as the p-type compound semiconductor layer, and the upper clad layer 4 is formed as the n-type semiconductor layer.

Also, the present invention is not limited to a case that there is a linear relation between the current amount injected to the light-emitting element 1 and the light quantity extracted from the light-emitting element 1. Namely, for example, when the luminescence amount of the light-emitting element 1 can be accurately controlled to the light quantity suitable for the sensitivity of the imaging device by adjusting the duty ratio and the lighting cycle, there is no necessity for making a linear relation between the current amount injected to the light-emitting element 1 and the light quantity extracted from the light-emitting element 1.

Example

Experiment results that support the effect obtained by this embodiment will be described hereafter.

Figure 4A:
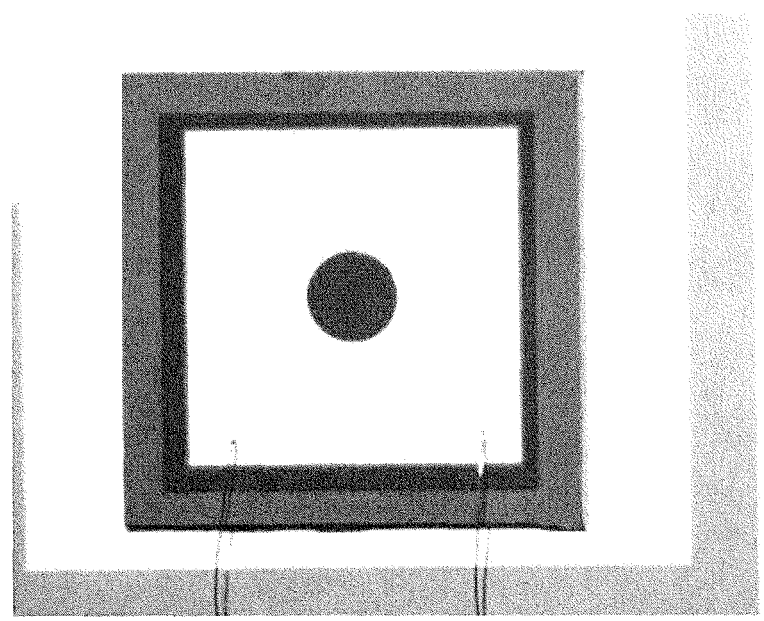
FIG. 4A is a planar photograph of the light-emitting element of an example.
Figure 4B:
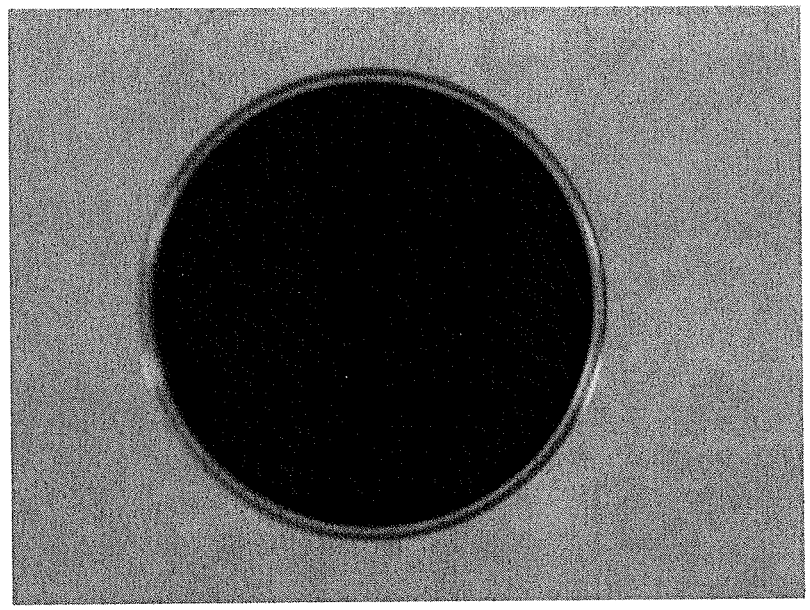
FIG. 4B is a partial expanded view of the light-emitting element of the example.

As an example, the light-emitting element was made, which has a configuration shown in FIG. 1A and FIG. 1B, and whose light extraction surface has a circular shape with a diameter of 1 mm, 100 μm, and 30 μm, and has a square shape with one side length of 5 mm. FIG. 4A is a planar photograph of the light-emitting element whose light extraction surface has a circular shape with a diameter of 1 mm, according to an example, and FIG. 4B is a partial expanded photograph thereof. Then, regarding the light-emitting element of each example, measurement was performed to I-L (current-optical output) characteristic, total luminous flux light quantity, sum of luminance values of the light extraction surface of the light-emitting element, and sum of luminance values of the light-emitting surface of the luminous body which is the measurement object.

Figure 5:
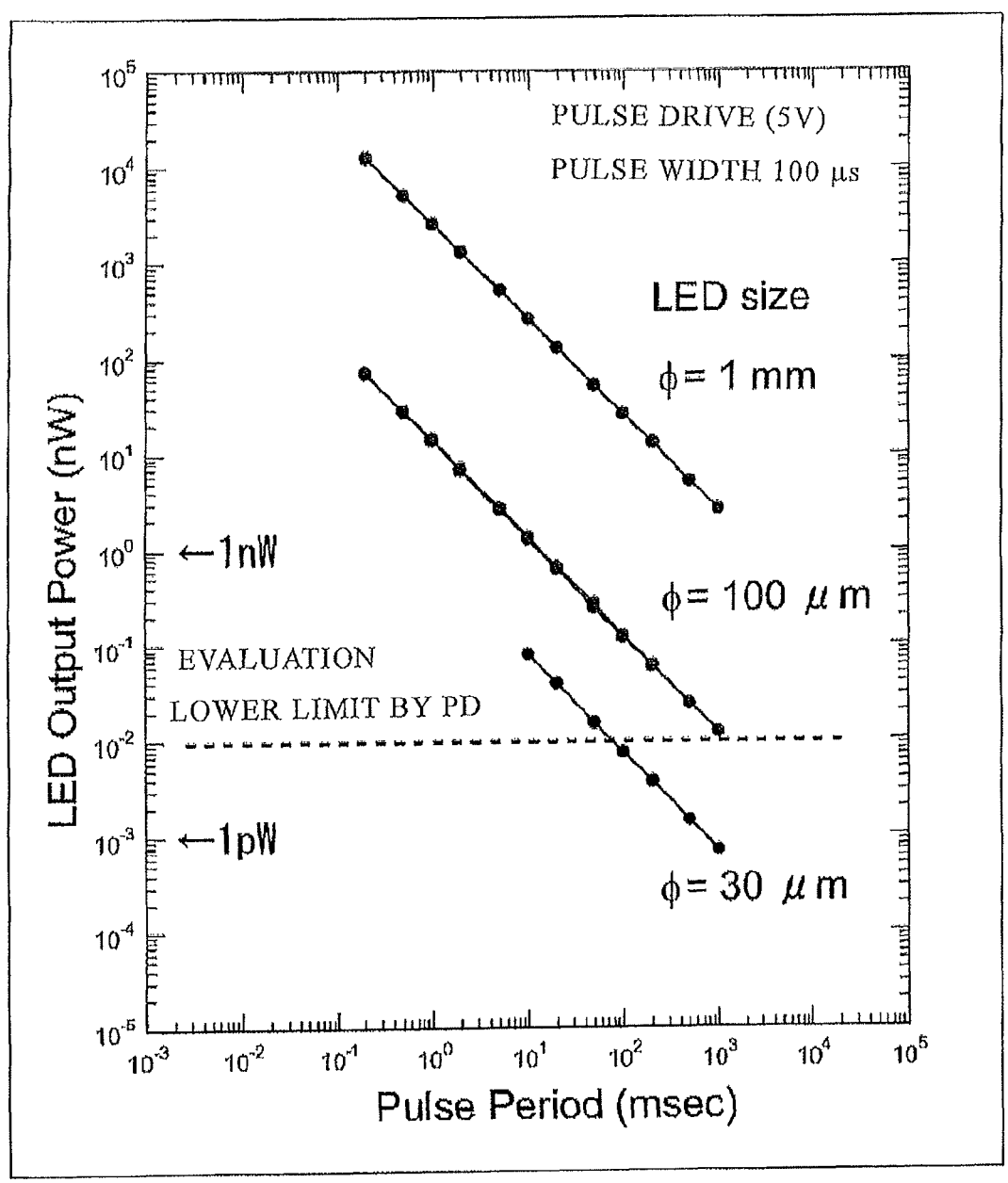
FIG. 5 is a view showing a measurement result of a pulse modulated output control characteristic of the light-emitting element of the example.

FIG. 5 is a view showing a measurement result of a pulse modulated output control characteristic of the light-emitting element according to an example. From FIG. 5, by adjusting the pulse ratio of the current injected to the light-emitting element of each example, it is found that the light quantity (light output) emitted from the light extraction surface of the light-emitting element of each example and extracted from the light extraction opening window varies in a wide range (milli to femto). For example, in a range between 0.02 mW and 500 fW, it is found that there is a linear relation between the current amount injected to the light-emitting element and the light quantity of the light-emitting element. Therefore, regarding the light-emitting element of each example, it is found that by acquiring (calibrating) the light quantity at at least two points of the light quantity of a lower limit or more of measurement by the existing PD (for example light of millimeter W equivalent), the light quantity extracted from the light extraction opening window of the light emitting element, can be controlled by adjusting the pulse ratio even in the region of the weak light corresponding to femto to milli W.

Figure 6A:
FIG. 6A is a photographed image of a light extraction surface when operating the light-emitting element of the example.
Figure 6B:
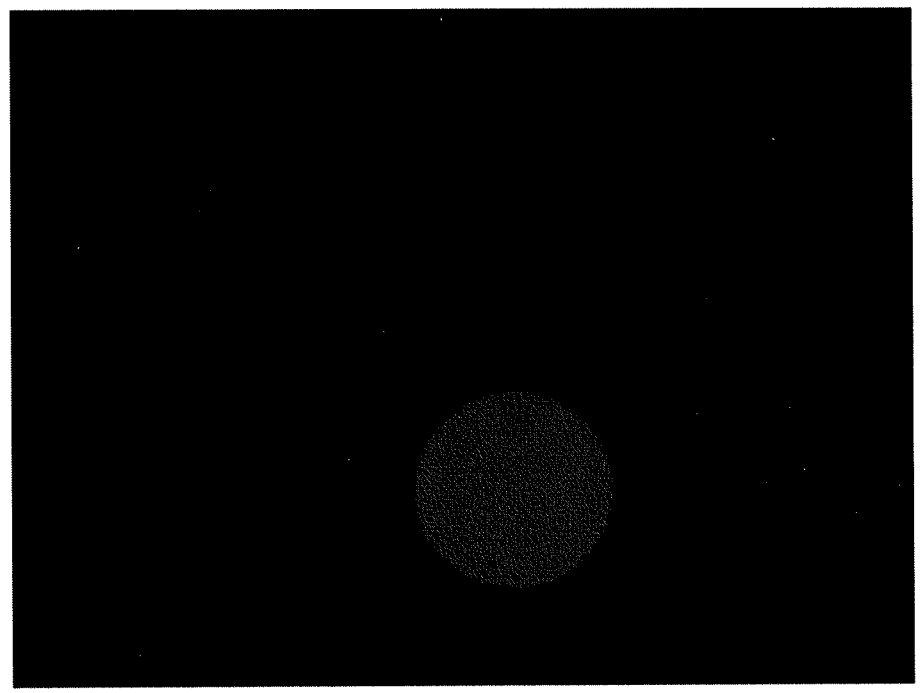
FIG. 6B is a photographed image of the light extraction surface when operating the light-emitting element of the example.

FIG. 6A and FIG. 6B are images obtained by photographing the light extraction opening window of the light-emitting element by the imaging device of the example. Namely, FIG. 6A and FIG. 6B are respectively photographed images outputted and obtained by photographing the light extraction opening window from above by the imaging device, by activating the light-emitting element of this example having the light extraction surface formed into a circular shape with a diameter of 100 μm. Specifically, FIG. 6A and FIG. 6B are expanded images of the light extraction opening window (light extraction surface) and its periphery, at the time of generating light emission (operating) of the light-emitting element under a prescribed condition. In FIG. 6A, the light emission is generated by the light-emitting element under conditions of application voltage of 4.5V, and injected current amount of 0.017 to 0.019 mA. In FIG. 6B, the light emission is generated by the light-emitting element under conditions of the application voltage of 5.0 V, and the injected current amount of 0.044 to 0.047 mA. From FIG. 6A and FIG. 6B, it is found that the light emission is generated by the light-emitting element of this example, only in the inside of the cylindrical insulator, namely, only in the light extraction surface. Namely, it can be confirmed that the light emission in the outside region of the insulator is prevented, and there is no leak of light from the region other than the light extraction surface. Further, no disturbance is caused in the light-emitting element of this example, due to the shadow of the components or scattering light of the components. Namely, it is found that in the photographed images shown in FIG. 6A and FIG. 6B, the shadow of the bonding wire, etc., or the scattering light is not photographed. Namely, it can be confirmed that there is no disturbance of the light emission due to the shadow of the components or the scattering light of the components.

Figure 7A:
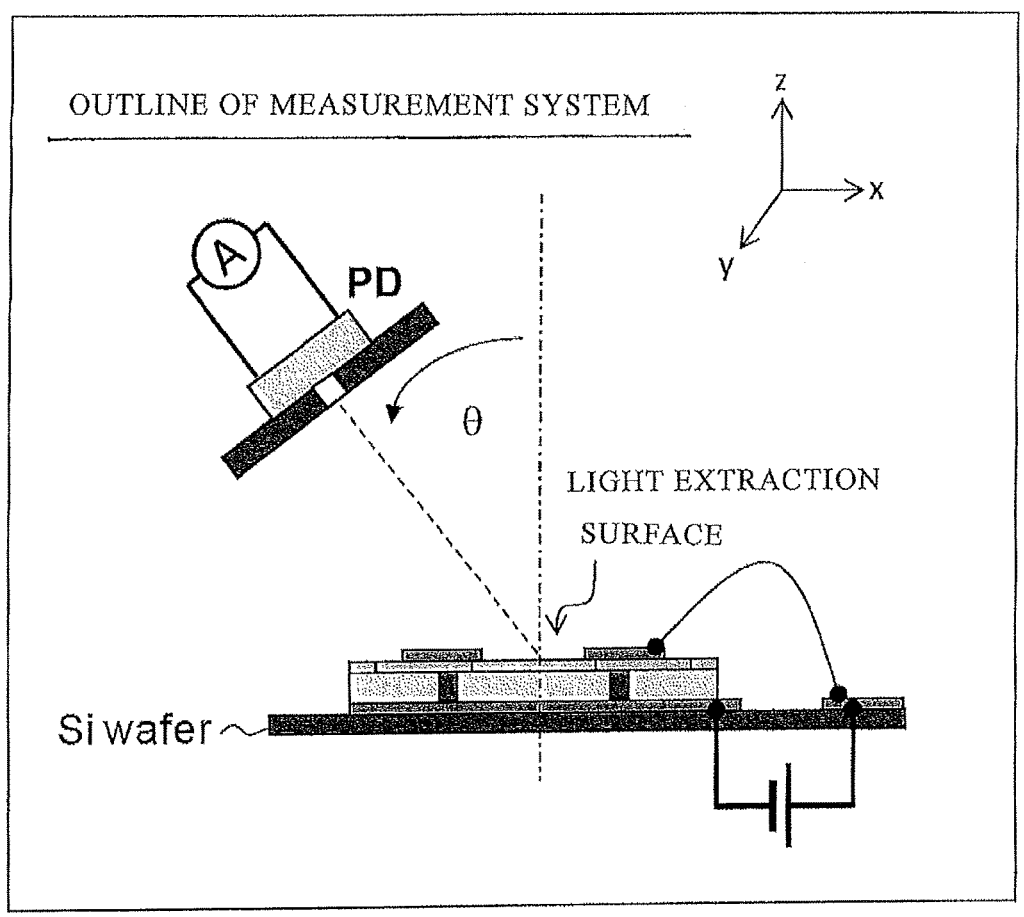
FIG. 7A is a schematic view of a measurement system of a light emission angle distribution.
Figure 7B:
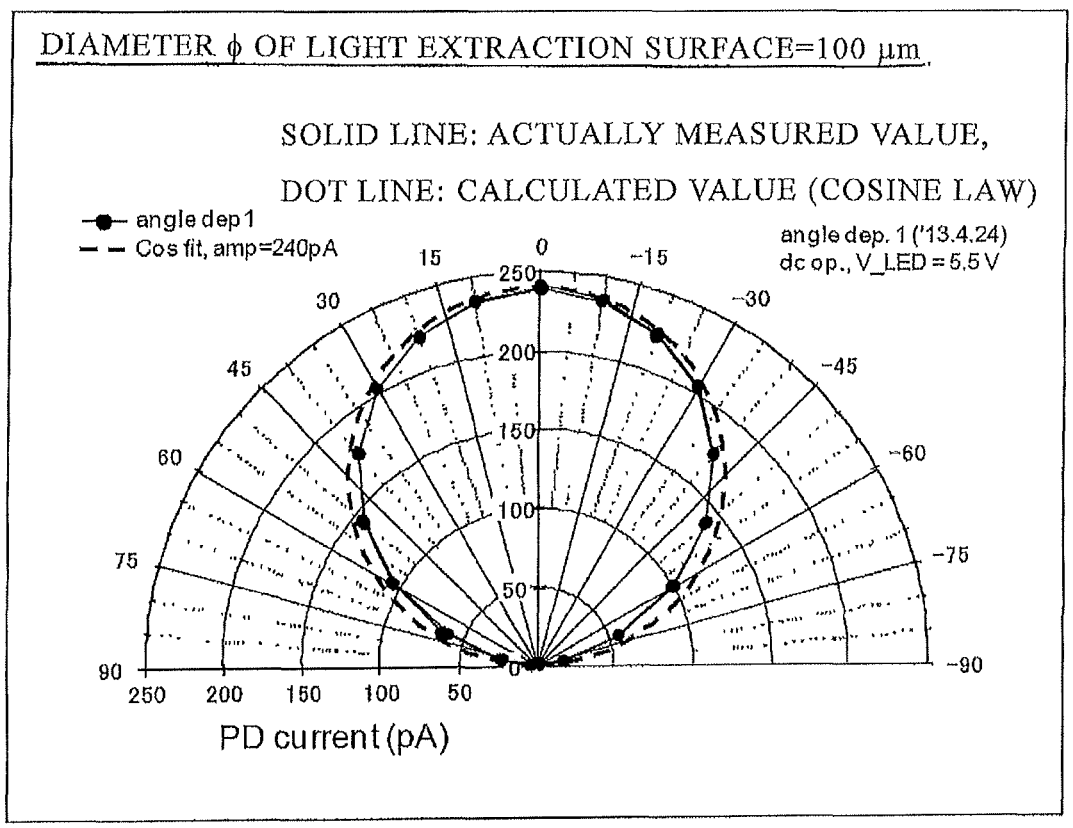
FIG. 7B is a view showing a measurement result of a light emission characteristic of the light-emitting element of the example.

FIG. 7A is a schematic view of a measurement system of the total luminous flux light quantity of the light-emitting element, and FIG. 7B is a view showing the measurement result of the total luminous flux light quantity of the light-emitting element whose light extraction surface of this example has a circular shape with a diameter of 100 μm. As shown in FIG. 7A, the measurement of the total luminous flux light quantity of the light-emitting element was performed using a photodetector. Specifically, the axis vertical to the light extraction surface of the light-emitting element and passing through the center of the light extraction surface was set as the central axis (0°), and the photodetector was moved from the central axis toward the x-axis by a prescribed angle (θ), to thereby measure the light intensity. From FIG. 7B, the total luminous flux light quantity of the light-emitting element of this example is found. From FIG. 7B, it is also found that in the light-emitting element of this example, the light emission angle distribution of the light emitted from the light extraction surface 12 and extracted from the light extraction opening window, becomes Lambert's emission law.

Figure 8A:
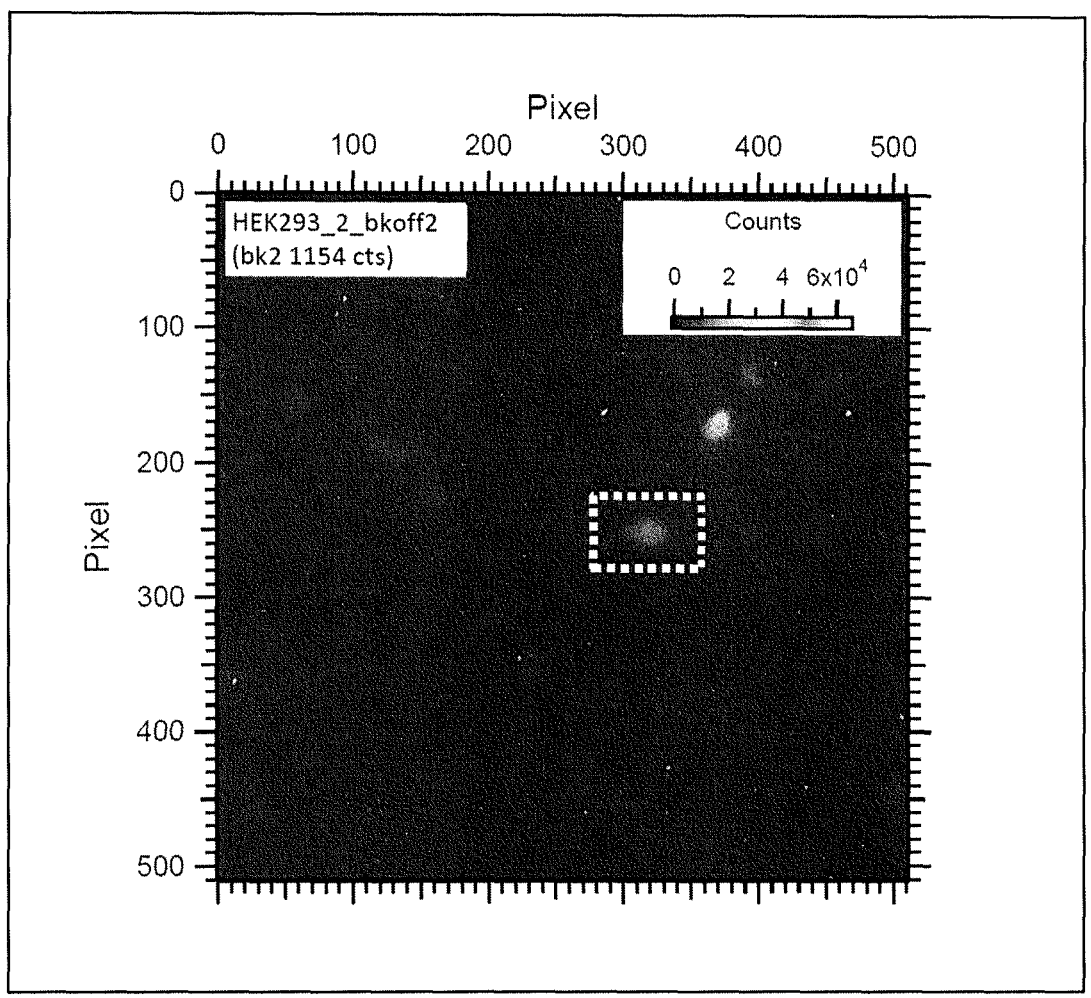
FIG. 8A is a photographed image of a luminous body which is a measurement object.
Figure 8B:
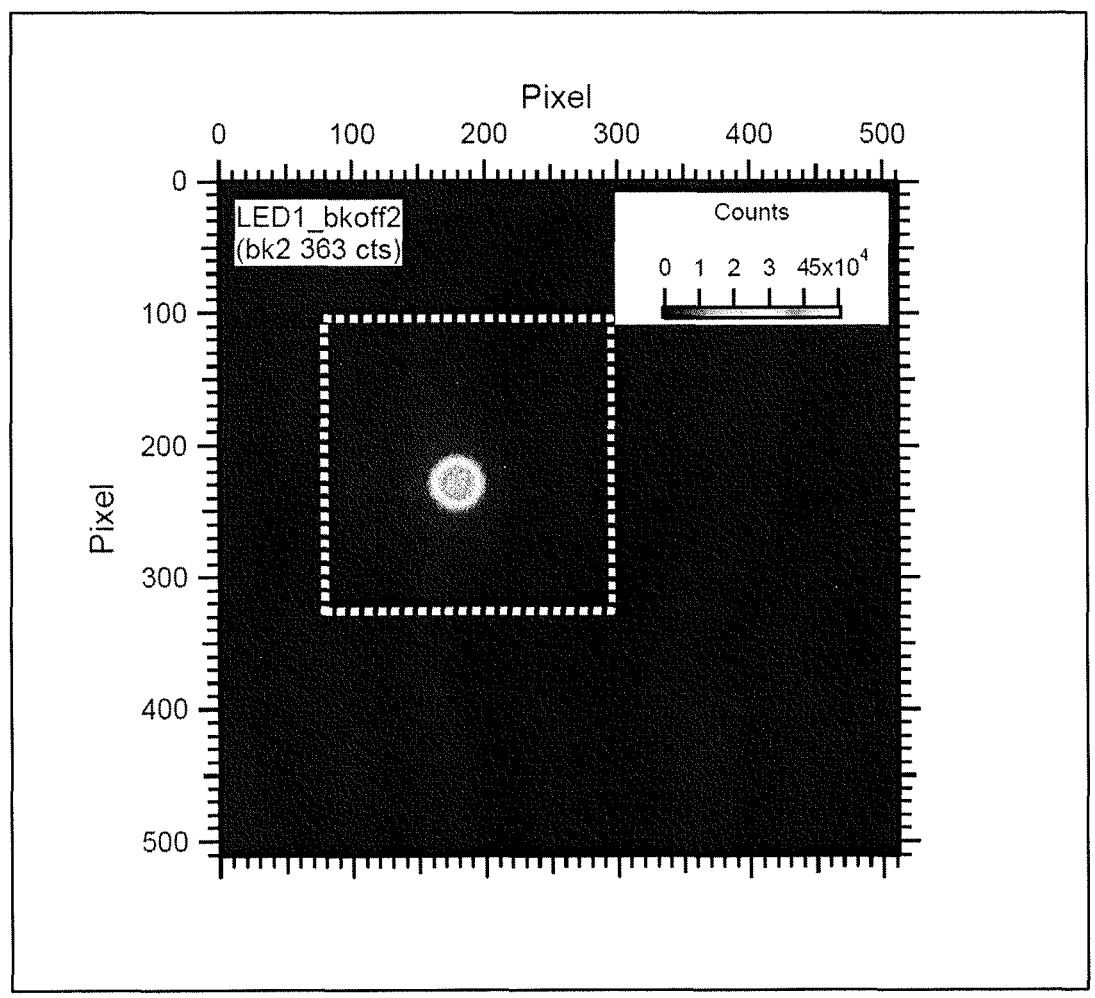
FIG. 8B is a photographed image of the light extraction surface of the light-emitting element of the example.

FIG. 8A is a photographed image of the luminous body which is a measurement object, and FIG. 8B is a photographed image of the light extraction surface of the light-emitting element according to this example. Specifically, FIG. 8A is a brightness image obtained by photographing the light-emitting surface by the imaging device, which is the light emitting surface of HEK 293 cell obtained by transfecting luciferase that emits red light, and digitizing and outputting the photographed image for each pixel. FIG. 8B is a brightness image obtained by photographing the light extraction surface by the imaging device, which is the light extraction surface of the light-emitting element having a circular shape with a diameter of 30 μm, and digitizing and outputting the photographed image for each pixel. From FIG. 8A and FIG. 8B, in each pixel, the sum of the luminance values of the light-emitting surface of the luminous body which is a measurement object, and the luminance values of the light extraction surface of the light-emitting element of this example, were respectively measured. Specifically, in each pixel, the sum of the luminance values of the region surrounded by a dot line shown in FIG. 8A and FIG. 8B, was measured, which was set as the sum of the luminance values of the light-emitting surface of the luminous body, and the sum of the luminance values of the light extraction surface of the light-emitting element respectively. Thus, the imaging device can be calibrated, namely, an absolute sensitivity can be acquired, and an absolute light quantity of the luminous body that emits the weak light can be accurately acquired. Further, by comparing the sizes of the images of FIG. 8A and FIG. 8B, it is found that the dimension of the light-emitting surface of the measurement object can be accurately acquired.

Second Embodiment

A second embodiment of the present invention will be described next, using FIG. 11A to FIG. 16.

(Background of Creating the Invention)

Various optical sensors such as a photodiode (PD), a photomultiplier tube (PMT), and a charge coupled device (CCD), etc., are used as a photo sensor included in an optical measurement device. A plurality of optical measurement devices incorporating these optical sensors are used, and in order to judge whether the optical measurement device is operated normally or whether normal detection sensitivity is maintained, a light source for calibration (validation) is required.

There are various measurement target samples of the optical measurement device, such as solids and liquids or containers. Therefore, a sample location of the optical measurement device has various shapes for each optical measurement device, and has a firmly shielded structure in many cases so that an external light does not enter. As the reference light source that can be used for the validation of the optical measurement device having such a shielded sample location structure, a shape suitable for the sample location part of the optical measurement device is desired, not requiring a power supply from outside of the reference light source, and not allowing the light quantity to be varied depending on the environmental temperature. In a case of a narrow space for the sample location part, a small size is desired.

By using the light emitting diode (LED) as the light-emitting element, it is possible to constitute the light source that can be driven by a small-sized battery without requiring an external power source. However, brightness (brightness of the light-emitting surface) of the LED varies depending on the environmental temperature. Therefore, the reference light source having a temperature controller for stabilizing the temperature is commercially available (manufactured by Nichia Corporation, and vendor: Otsuka Electronics Co., Ltd). However, such a light source requires the external power source for driving the temperature controller requiring large power consumption, and therefore is not suitable for the use in a closed space like the shielded sample location part of the optical measurement device.

In addition, in order to correct the light quantity, the light source of the following type is also commercially available (stabilized light source for photomultiplier: by Hamamatsu Photonics KK), which is configured to correct the light quantity to be constant while actually measuring the light quantity with PD incorporated therein. The light source of this type is sold as a light quantity constant type which is an evaluation light source for PMT. However, PD is contained at more emission side than the light emission part, thus requiring a structure for allowing a light reflection to occur inside of the light source so that the shadow is not generated. Therefore, such a type of the light source is not suitable for the use of varying the light quantity.

As a result of strenuous efforts to solve such a problem, inventors of the present invention achieve a new technique of the reference light source capable of suppressing a variation of the light quantity caused by the variation of the environmental temperature. The configuration, etc., of the reference light source according to an embodiment of the present invention will be described hereafter.

(Configuration of the Reference Light Source)

Figure 11A:
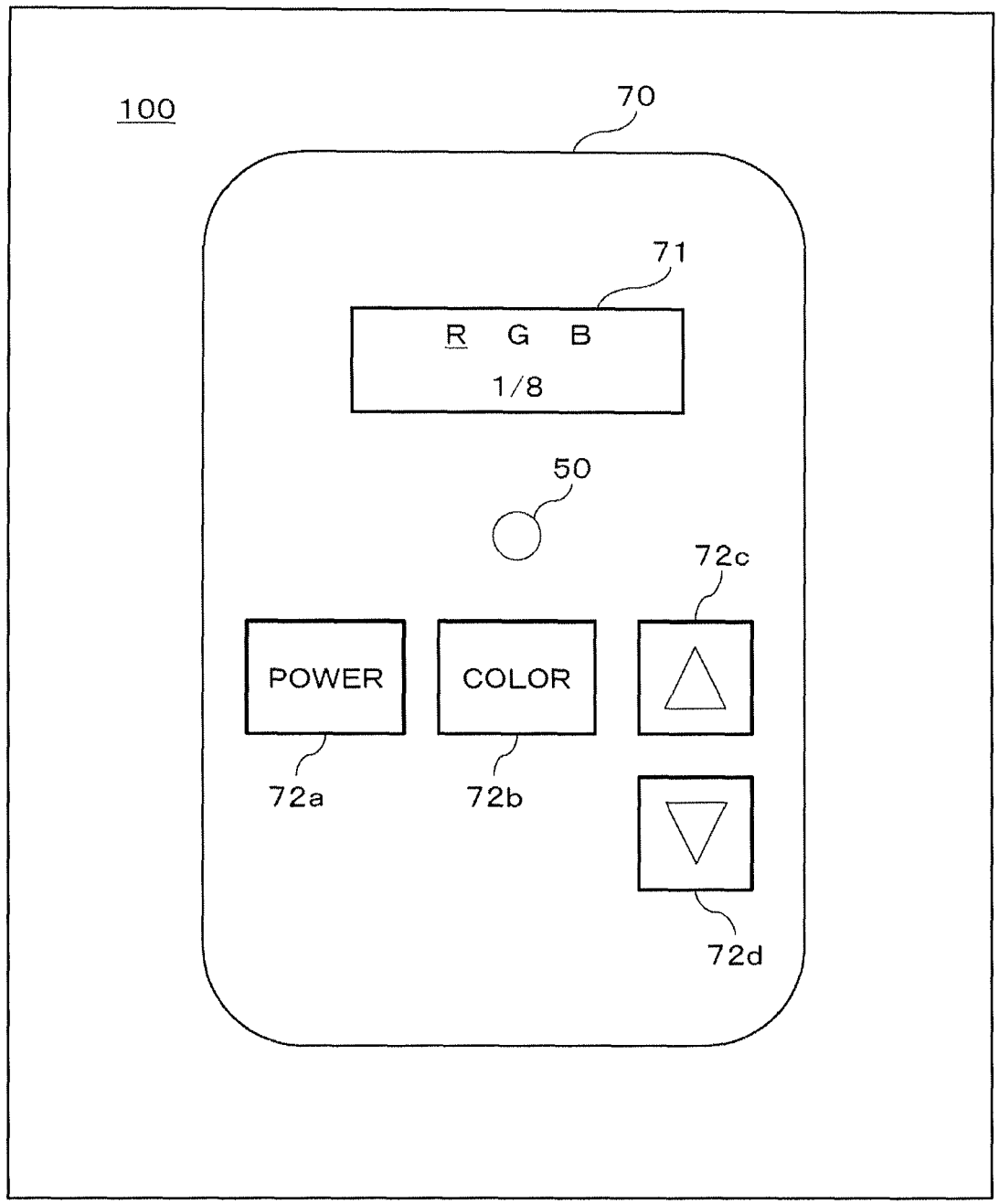
FIG. 11A is a schematic top view of a reference light source according to a second embodiment.
Figure 11B:
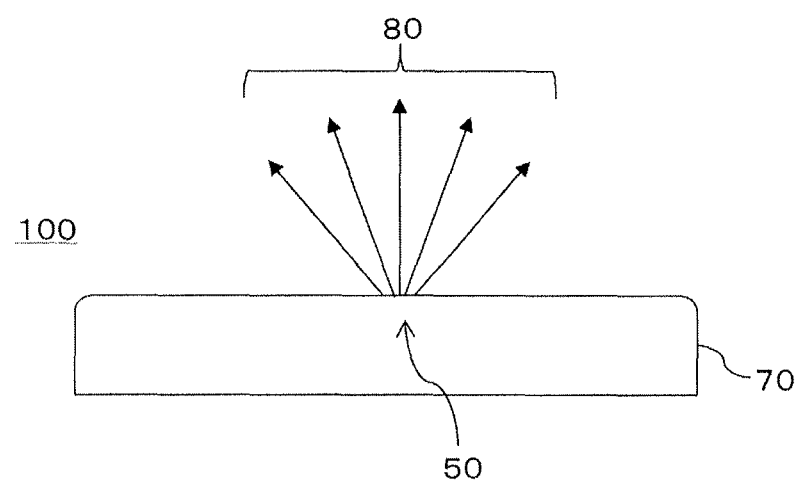
FIG. 11B is a schematic top view of the reference light source shown in FIG. 11A.

As shown in FIG. 11A and FIG. 11B, the reference light source of this embodiment is configured to emit a weak light having a precisely controlled and variable light quantity of about 10 fW to 10 pW for example. The reference light source of this embodiment is configured so that it can be operated in the closed space in which power supply cannot be performed from outside, like the sample location part of the optical measurement device.

For example, operation buttons 72a to 72d are arranged on an upper surface part of a case 70, as operators for setting each kind of operation by a user. On/Off of the power supply of the reference light source 100 can be switched by the operation button 72a. A luminescent color can be selected by the operation button 72b. A light quantity value can be set by the operation buttons 72c and 72d. The light quantity value can be increased by the operation button 72c, and the light quantity value can be decreased by the operation button 72d.

The reference light source 100 is configured to set a light quantity value for each luminescent color of red (R), green (G), and blue (B) independently. Thus, light emission of an arbitrary one color of RGB, an arbitrary combination of RGB, or all three colors of RGB, can be generated with a desired light quantity.

Further, a display panel 71 is disposed on the upper surface part of the case 70. A set luminescent color and set light quantity values inputted through the operation buttons 72a to 72d are displayed on the display panel 71. FIG. 11A shows a state in which the light quantity value of "⅛" is selected for the luminescent color of red (R).

Also, a light emission part 50 is disposed on the upper surface part of the case 70. Light 80 having the luminescent color and the light quantity value set by the user, is emitted from the light emission part 50. A light-emitting element 1 described in the first embodiment, and the light emitting diode (LED) which is a semiconductor light-emitting element, can be used as the light-emitting element of the light emission part 50.

Here, the brightness at the time of lighting (at the time of continuous lighting) of the light-emitting element (LED), is expressed by a term of "brightness of a light-emitting surface" which is the brightness of the light-emitting surface of the light-emitting element, and the brightness during a pulse light emission of the light-emitting element (LED) (during intermittent lighting in which lighting and light-out are alternately repeated) is expressed by the term of "an average brightness of the light-emitting surface" as a temporally average brightness. Further, the brightness of the light emission from the light emission part 50 of the reference light source 100 (brightness through a light neutral density filter 51 described later) is expressed by a "light quantity". The "light quantity" is expressed by W (=J/sec) unit for example. The "light quantity" corresponds to the "light quantity value" which is a set value in the reference light source 100.

The reference light source 100 of this embodiment is configured to vary the light quantity by changing the average brightness of the light-emitting surface of the light emission from LED, using a pulse width modulation (PWM) for controlling the pulse width which is a lighting time per once, and a frequency which is the number of times of lighting per unit time.

However, the brightness of the light-emitting surface of LED is varied according to an operation temperature. Accordingly, if the environmental temperature is different, an actually obtained light quantity is varied due to the variation of the brightness of the light-emitting surface of LED, even in a case of a drive at the same set light quantity value. Such a variation of the light quantity is not desirable as the reference light source which is supposed to be used under various environmental temperatures.

As described hereafter, the inventors of the present invention propose the reference light source capable of suppressing the variation of the brightness of the light-emitting surface of the light-emitting element, which is caused by the variation of the environmental temperature, and thus capable of suppressing the variation of the light quantity even in a case of using the light-emitting element like LED having the characteristic that the brightness of the light-emitting surface is varied according to the operation temperature.

Figure 12:
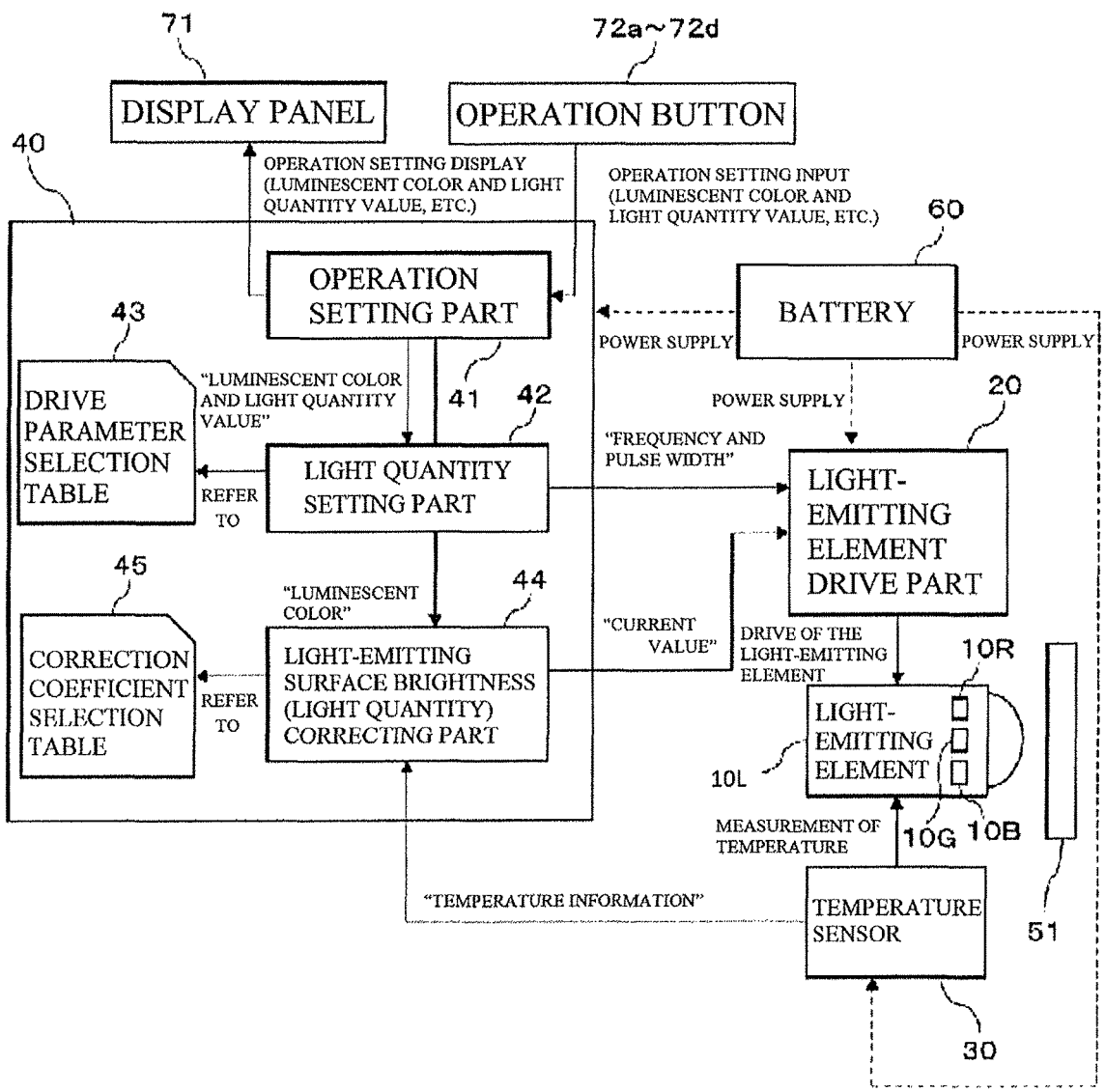
FIG. 12 is a schematic block diagram of the reference light source according to the second embodiment.

A further specific device configuration of the reference light source 100 of this embodiment will be described, with reference to FIG. 11A, FIG. 11B, and also FIG. 12. FIG. 12 is a schematic block diagram of a constant current drive type reference light source 100.

A light-emitting element 10L of the light emission part 50 is configured as the light-emitting element of multi colors including red LED 10R, green LED 10G, and blue LED 10B. For example an element configured similarly to the light-emitting element 1 shown in the abovementioned first embodiment can be suitably used as red LED 10R, green LED 10G, and blue LED 10B respectively. Also, for example RGB color LED (chip type) by Rohm Co., Ltd can also be used as the light-emitting element 10L. A light-emitting element drive part 20 is configured to drive the light-emitting element 10L. Specifically, the light-emitting element drive part 20 includes a constant current source, and configured to drive LED 10R to LED 10B of the light-emitting element 10L, with a constant current.

A temperature sensor 30 is configured to measure the temperature of the light-emitting element 10L. The temperature sensor 30 is disposed at a position not interfering with the light emitted from the light emission part 50, namely at a position not allowing the shadow to be generated, and at a position near the light-emitting element 10L, for example on the same substrate as the substrate on which the light-emitting element 10L is disposed. The temperature sensor 30 is configured to repeat measurement of the temperature for example for every constant time, for example for every 5 seconds, or for example for every 1 second, and output temperature information corresponding to the measured temperature, to a light-emitting surface brightness correcting part 44.

A controller 40 is configured including an operation setting part 41, a light quantity setting part 42, a drive parameter selection table 43, a light-emitting surface brightness (light quantity) correcting part 44, and a correction coefficient selection table 45. The controller 40 is configured by a microprocessor (MPU) for example.

The setting for operating the luminescent color and light quantity value, etc., is inputted in the operation setting part 41 through the operation buttons 72a to 72d. The operation setting part 41 is configured to display the inputted operation setting on the display panel 71. Further, the operation setting part 41 is configured to output information regarding the set luminescent color and light quantity, etc., to the light quantity setting part 42, and output information regarding the set luminescent color to the light-emitting surface brightness correcting part 44.

Based on the information regarding the set luminescent color and light quantity value, the light quantity setting part 42 is configured to set a parameter for driving the LED of the set luminescent color at a set light quantity value level, with reference to the drive parameter selection table 43. The drive parameter selection table 43 is the table storing a correlation between the light quantity value and the drive parameter for driving LED at the set light quantity value level. For example, the frequency and the pulse width, etc., are set as drive parameters.

FIG. 13 shows an example of the drive parameter selection table 43. In this example, 12 stages of the light quantity values such as "full", "½" to "¹⁄₁₀₂₄", and "off (zero)" are prepared as the light quantity values that can be set. The light quantity value "full" corresponds to a continuous lighting in which the light-out time is not provided (light-out time is zero), which is the setting of a brightest light quantity value. The light quantity value "off (zero)" corresponds to a complete light-out, which is the setting of a darkest light quantity value.

Each of the light quantity values "½" to "¹⁄₁₀₂₄" is the light quantity value expressed by a ratio of the lighting time with respect to the light quantity value "full". For example, the light quantity value "⅛" corresponds to, for example, a light emission in which the lighting is repeated with a pulse width of 35.0 μs at a frequency of 3600 Hz.

The light quantity values "½" to "¹⁄₂₅₆" are the setting in which every half of the light quantity is decreased, by decreasing every half of the frequency while maintaining a constant lighting pulse width at 35.0 μs. The light quantity value "¹⁄₅₁₂" is the setting in which the lighting pulse width is decreased to ½ at 17.5 μs, and the light quantity is decreased to ½, while maintaining a constant frequency with respect to the light quantity value "¹⁄₂₅₆". The light quantity value "¹⁄₁₀₂₄" is the setting in which the light quantity is decreased to ½, while maintaining the constant lighting pulse width at 17.5 μs for example with respect to the light quantity value "¹⁄₅₁₂" and decreasing the frequency to ½". The pulse width or the frequency of FIG. 13 is shown as an example, and the setting of the pulse width or the frequency may be changed as needed. The difference of the light quantity in one stage of the light quantity values, may be set to a value other than ½ or 2-fold of the example as needed.

Temperature information corresponding to the temperature of the light-emitting element 10L measured by the temperature sensor 30, is inputted in the light-emitting surface brightness correcting part 44. Based on the information regarding the luminescent color and the temperature information received from the temperature sensor 30, the light-emitting surface brightness correcting part 44 refers to the correction coefficient selection table 45 for the LED of the luminescent color, and sets a correction coefficient. The correction coefficient selection table 45 is the table storing a correlation between the temperature and the correction coefficient at this temperature.

Generally, LED has a tendency of decreasing the brightness of the light-emitting surface as the environmental temperature is raised, and also has a tendency of increasing the brightness of the light-emitting surface as the environmental temperature is decreased, even if being driven under the same condition (the same current in this example). A decrease of the brightness of the light-emitting surface can be corrected by increasing a drive current value, and an increase of the brightness of the light-emitting surface can be corrected by decreasing the drive current value More specifically, the brightness of the light-emitting surface can be corrected as follows. At a reference temperature, the brightness of the light-emitting surface when driven at a reference current value J0 is defined as a reference brightness of the light-emitting surface I0. At an actual environmental temperature, the brightness of the light-emitting surface when driven at the reference current value J0 is defined as the brightness of the light-emitting surface I1. The ratio I0/I1 of the reference brightness of the light-emitting surface 10 with respect to the brightness of the light-emitting surface I1, is a value larger than 1 when the brightness of the light-emitting surface I1 is lower than the reference brightness of the light-emitting surface I0, and is a value smaller than 1 when the brightness of the light-emitting surface I1 is higher than the reference brightness of the light-emitting surface I0. Therefore, by multiplying the reference current value J0 by this ratio I0/I1 as a correction coefficient, a corrected current value can be set. If the reference temperature and the actual environmental temperature are equal to each other, the ratio I0/I1, namely the correction coefficient is 1.

The correction coefficient can be previously prepared as follows. The brightness of the light-emitting surface I1 is measured at each temperature by driving the LED at the reference current value J0 while varying the temperature. The correction coefficient I0/I1 at each temperature can be obtained, when the brightness of the light-emitting surface at a suitable reference temperature (for example, at a temperature of a room temperature of about 25° C.) is defined as the reference brightness of the light-emitting surface I0. The number of measurement points of the temperature can be suitably defined in consideration of accuracy of the measurement and a labor. Also, the correction coefficient at a temperature between measurement points, can be obtained by an interpolation calculation. The correction coefficient selection table 45 can be constituted by the correction coefficient obtained by the measurement, or each kind of parameter, etc., required for the interpolation calculation. A specific configuration mode of the correction coefficient selection table 45 can be variously changed as needed, and for example, can be a mode in which the measurement results of the temperature and the brightness of the light-emitting surface required for calculating the correction coefficient are stored in the correction coefficient selection table 45.

Temperature dependency of the brightness of the light-emitting surface is different depending on the individual LED. Accordingly, preferably the temperature dependency of the brightness of the light-emitting surface is measured for each of the red LED 10R, the green LED 10G, and the blue LED 10B, so that each correction coefficient of the LEDs 10R, 10G, 10B can be obtained from the correction coefficient selection table 45.

FIG. 14 is an example of (a part of) the correction coefficient selection table 45, and for example, shows the correction coefficient for the blue LED 10B. The correction coefficient is set for the temperature within the environmental temperature, for example, within a range of 15° C. to 45° C. In the example shown in the figure, the correction coefficient at every 5° C. is shown. The correction coefficient at a temperature between the shown temperatures, can be obtained by the interpolation calculation as needed. For example, the correction coefficient can be obtained for example in increments of 0.1° C., by a linear interpolation for example. A temperature range and the correction coefficient of FIG. 14 are given as examples, and the setting of the temperature range and the correction coefficient, etc., may be changed as needed.

The light-emitting surface brightness correcting part 44 sets a corrected current value for each luminescent color, by multiplying the reference current value J0 which is a drive current value as a reference, by the set correction coefficient.

The frequency and the pulse width set by the light quantity setting part 42, and the current value subjected to a temperature correction by the light-emitting surface brightness correcting part 44, are inputted in the light-emitting element drive part 20. The light-emitting element drive part 20 performs constant-current drive of each LED 10R to 10B of the light-emitting element 10L at a current value received from the light-emitting surface brightness correcting part 44. Thus, the variation of the brightness of the light-emitting surface caused by the variation of the environmental temperature is suppressed, so that each LED 10R to 10B can be lightened in approximately a constant brightness of the light-emitting surface. Here, the "approximately constant" can be defined as follows: a variation width of the brightness of the light-emitting surface in the environmental temperature range (for example in a range of 15° C. to 45° C.) is preferably within ±1%, and more preferably within ±0.5%.

The light-emitting element drive part 20 also performs light emission at the set light quantity value, by lighting and light-out of each LED 10R to 10B of the light-emitting element 10L and generating the light emission of them with a prescribed average brightness of the light-emitting surface, at the frequency and the pulse width received from the light quantity setting part 42. By suppressing the variation of the brightness of the light-emitting surface of each LED 10R to 10B which is caused by the temperature variation, the variation of the light quantity in the light emission at the set light quantity value, can be suppressed. The light-emitting surface brightness correcting part 44 can also be regarded as a light quantity correcting part.

Update of setting of the correction coefficient, namely, update of the corrected current value can be performed, every time the temperature information is received from the temperature sensor 30 by the light-emitting surface brightness correcting part 44, or every time the temperature information received from the temperature sensor 30 is varied.

The neutral density filter (ND filter) 51 is disposed at an upper side (emission side) of the light-emitting element 10L. The light incident from the light-emitting element 10L and attenuated by the neutral density filter 51, is a light 80 emitted from the light emission part 50.

The abovementioned measurement of the brightness of the light-emitting surface for obtaining the correction coefficient, is performed before assembly of the product, for example by measuring the brightness of the light-emitting surface by photodiode (PD), which is the light-emitting surface of each LED 10R to 10B driven by continuous lighting (light quantity value: "full"). In order to measure the brightness of the light-emitting surface by PD, for example brightness of about 1 μW (for example about 500 μA as the drive current of LED) is required.

However, the light of such a degree of brightness is excessively bright to a high sensitivity light sensor such as a photomultiplier tube (PMT) which is supposed to be subjected to validation using the reference light source 100 of this embodiment, resulting in a saturation of the optical sensor. Therefore, in the reference light source 100 of this embodiment, the neutral density filter 51 is used for attenuating an output from the LED to $1/10^5$ to $1/10^6$ for example, to thereby reduce the output at the light quantity value "full" to about 10 pW. Further, by performing control of the light quantity as described above, a variable weak light can be obtained, which can be outputted for example in a range of 10 fW to 10 pW. When an emission distribution of the light is desired to be changed, a suitable light scattering plate can be utilized.

As an advantage of setting the drive current of LED to a magnitude of about 500 μA (for example to a brightness of about 1 μW by continuous lighting), the following point can be given other than a point that the measurement of the brightness of the light-emitting surface becomes easy for obtaining the correction coefficient.

If the light emission is performed, with a suitable brightness for the high sensitivity optical sensor such as PMT, etc., without using the neutral density filter 51, the drive current of LED must be suppressed to about several pA. However, if the LED is driven with such a weak current, components used for LED and other circuit act as a condenser, thus making it difficult to obtain a proper rectangular PWM control waveform. In the reference light source 100 of this embodiment, by setting the drive current of LED in the magnitude of about 500 μA for example, it becomes easy to perform PWM control in the proper rectangular control waveform, and it becomes easy to perform a precise control of the light quantity. When not a general LED but an element constituted similarly to the light-emitting element 1 described in the first embodiment is used, it is easy to maintain the PWM control waveform in a rectangular shape, even if the drive current is set to be small (for example, to less than 500 μA).

When the proper rectangular PWM control waveform can be obtained, and the measurement of the brightness of the light-emitting surface for obtaining the correction coefficient can be performed by a certain optical sensor, the drive current of LED, namely the standard of the reference current value multiplied by the correction coefficient, is not limited to about 500 μA of the example. As a suitable range of the reference current value, for example a range of 100 μA to 500 μA can be given. The reference current value can be set independently for each LEDs 10R to 10B of each luminescent color.

A battery 60 is configured to supply power to each of the light-emitting element drive part 20, the temperature sensor 30, and the controller 40. The battery 60 is for example a button battery having a voltage of 3V. For example, the button battery having a voltage of 3V can be used by boosting the voltage to 4.2 V. The case 70 is configured to integrally contain the components such as the light-emitting element 10L, the light-emitting element drive part 20, the temperature sensor 30, the controller 40, and the battery 60, etc. The reference light source 100 is driven by the battery 60 contained in the case 70 together with the components such as the light-emitting element 10L, etc., and therefore can be operated even in a closed space to which power cannot be supplied from outside.

As described above, the reference light source 100 of this embodiment can emit the weak light with a precisely controlled variable light quantity of about 100 fW to 10 pW for example, and also can be operated in the closed space like a sample setting part of the optical measurement device, to which power cannot be supplied from outside.

Further, the reference light source 100 of this embodiment is configured to vary the current value for driving the light-emitting element 10L by the light emitting drive part 20, so as to suppress the variation of the brightness of the light-emitting surface of the light-emitting element 10L, which is caused by the variation of the environmental temperature. Thus, the variation of the light quantity when the environmental temperature is varied, can be suppressed.

Modified Embodiment

In the abovementioned second embodiment, explanation is given for an example of suppressing the variation of the brightness of the light-emitting surface by driving the light-emitting element with a constant current, and correcting the current value. However, the second embodiment is not limited thereto, and can be variously modified in a range not departing from the gist of the invention.

For example, as a modified example, it is also acceptable that based on the temperature information, the controller suppresses the variation of the brightness of the light-emitting surface by correcting the drive voltage value of the light-emitting element, namely, varies the drive voltage value of the light-emitting element so that the variation of the brightness of the light-emitting surface is suppressed. However, it is easier to control to correct the brightness of the light-emitting surface by the current, and easier to reduce the variation of the brightness of the light-emitting surface, than to correct the brightness of the light-emitting surface by the voltage.

Further, for example, as other modified example, it is also acceptable that instead of correcting the brightness itself of the light-emitting surface, the controller corrects the frequency and the pulse width (at least one of them) by PWM control based on the temperature information, and suppresses the variation of the average brightness of the light-emitting surface (namely, at least one of the pulse width or the frequency is varied so as to suppress the variation of the average brightness of the light-emitting surface). However, when such a correction is made, a temporal parameter such as the frequency and the pulse width is finely adjusted, and a drive at a relatively high clock frequency is performed. However, when the clock frequency is high, power consumption becomes high.

It is preferable that the reference light source driven by battery, is operated with a low consumption power. Accordingly, from a viewpoint of reducing the power consumption, it is preferable to use a method of correcting the brightness of the light-emitting surface by finely adjusting the current value, like the abovementioned embodiment. In addition, as described in the abovementioned second embodiment, a large variation of the light quantity like a case that the light quantity value is varied in geometric progression for example by ½ or by 2-fold, can be performed by PWM control with suppressed power consumption, using the relatively low clock frequency.

Example

Explanation is given hereafter for a test result that supports the effect obtained by this embodiment.

The brightness of the light-emitting surface was measured for every LED of each luminescent color while varying the environmental temperature, to obtain a variation curve of the brightness of the light-emitting surface showing a temperature dependency of the brightness of the light-emitting surface, and obtain a current correction coefficient from the variation curve of the brightness of the light-emitting surface which shows the temperature dependency of the brightness of the light-emitting surface, and from this variation curve of the brightness of the light-emitting surface, the current correction coefficient was obtained for maintaining approximately a constant brightness of the light-emitting surface even if the temperature is varied.

Figure 15:
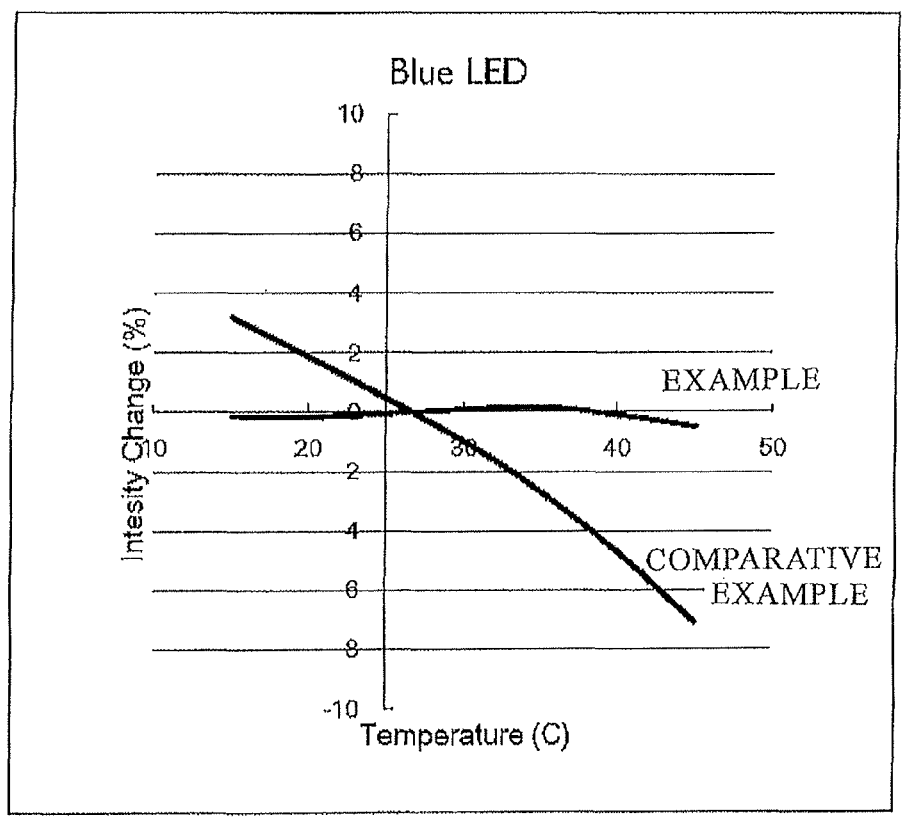
FIG. 15 is a view showing a variation curve of a brightness of a light-emitting surface according to an example and a comparative example.

FIG. 15 shows the variation curve of the brightness of the light-emitting surface according to an example, and the variation curve of the brightness of the light-emitting surface according to a comparative example. The horizontal axis indicates the temperature in ° C. unit, and the vertical axis indicates the variation of the brightness of the light-emitting surface in % unit. Blue LED was driven with a current value corrected at each temperature in the example, and the blue LED was driven with a constant current value (without correcting the current value at each temperature) in the comparative example. The measurement was performed regarding a temperature range of 15° C. to 45° C. The comparative example showed a tendency of lowering the brightness of the light-emitting surface as the temperature was raised. The example showed that approximately a constant brightness of the light-emitting surface could be maintained in a wide temperature range of 15° C. to 45° C.

The linearity of the reference light source according to the example of the present invention was examined, by a luminesensor JNR (by ATTO Corporation) which is a luminescence measurement device of a photon counting system in which PMT is used as a detector. Here, the linearity means a linear property of a relation between the set light quantity value (set output) of each luminescent color of the reference light source according to the example, and a measured value obtained by the measurement device.

Figure 16:
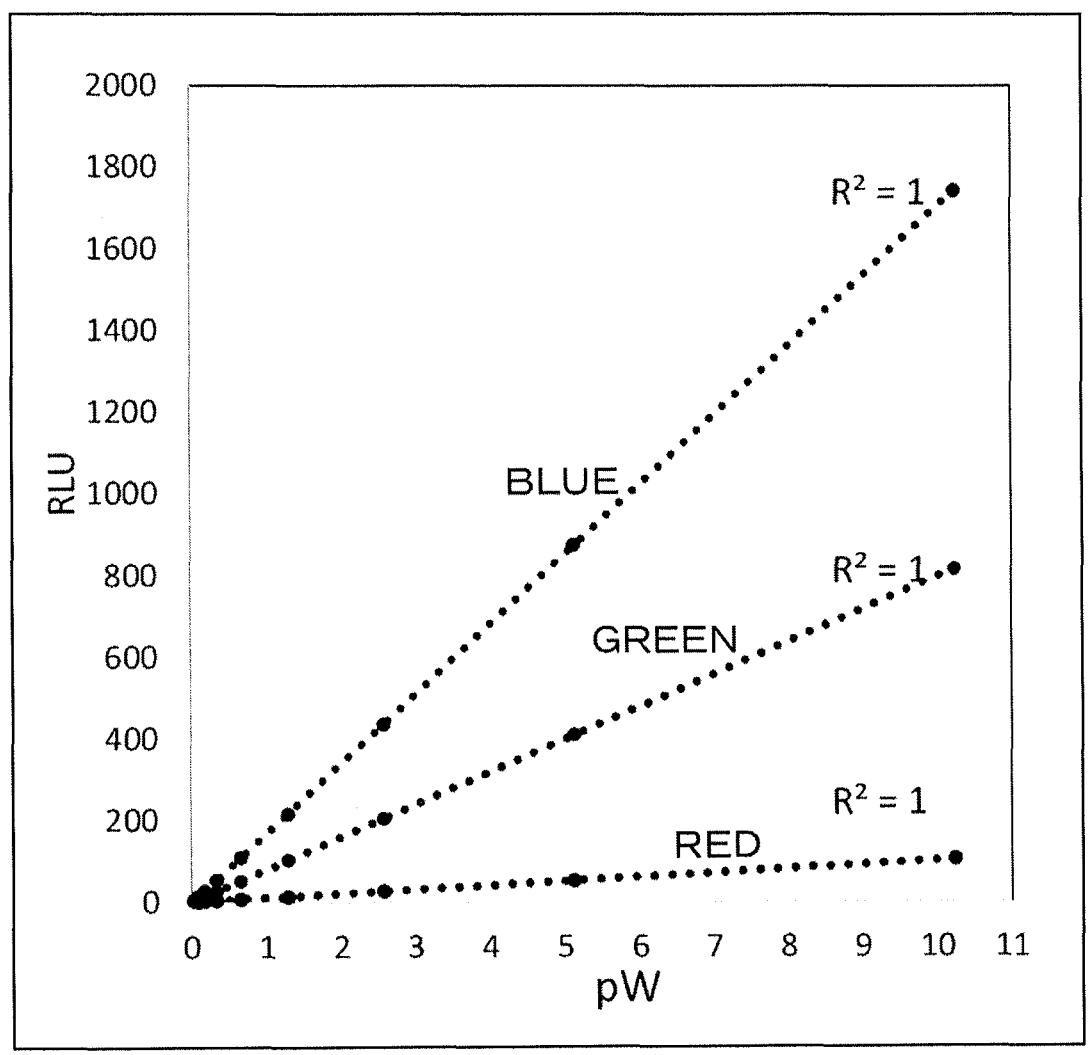
FIG. 16 is a view showing a linearity of a light emission according to an example.

FIG. 16 is a graph showing the linearity of the light emission in the reference light source of the example. The horizontal axis indicates the output of each luminescent color of the reference light source according to the example, which is expressed by pW unit, and the vertical axis indicates the measured value obtained by the measurement device, which is expressed by relative luminescence units (RLU). As a result of the measurement, it was confirmed that a satisfactory linear relation could be obtained in each luminescent color. It was also simultaneously shown that the sensitivity of each color was different depending on a wavelength sensitivity characteristic of PMT, for example, the sensitivity of a red color of PMT was 1/10 or less of the sensitivity of a blue color.

The measurement device (Japanese Patent No. 4052389) is put into practical use, which is capable of measuring the light quantities of luminescent components of a plurality of colors by separating them from each other. However, conventionally there is no reference light source for verifying that a measurement result of this measurement device is correct. The reference light source of the example can emit the light of a plurality of luminescent colors with a precisely controlled light quantity, and therefore is suitable as the light source for verifying the operation of the measurement device.

Other Embodiment

As described above, embodiments of the present invention have been specifically described. However, the present invention is not limited to the abovementioned embodiments, and can be variously modified in a range not departing from the gist of the invention. For example, it is obvious for a skilled person that various modifications, improvements, and combinations, etc., can be applied to the abovementioned embodiments.

<Preferred Aspect of the Present Invention>

Preferred aspects of the present invention will be supplementarily described hereafter.

(Supplementary Description 1)

There is provided a light-emitting element, in which a light whose emission angle distribution is one of Lambert's emission law or uniform Isotropic emission, is extracted from a light extraction opening window, and an in-plane distribution of a light intensity on a light extraction surface of the light extraction opening window is uniform, and which can be used as a reference light source when measuring an absolute light quantity of a weak light emitted from a luminous body which is a measurement object.

(Supplementary Description 2)

There is provided the light-emitting element of the supplementary description 1, including:
    a lower clad layer;
    a light-emitting layer formed on the lower clad layer;
    an upper clad layer formed on the light-emitting layer;
    a transparent electrode formed on the upper clad layer;
    a cylindrical insulator provided so as to embed a groove formed at a depth that reaches at least the light-emitting layer from a surface side of the transparent electrode;
    a surface electrode formed on the transparent electrode, having an opening by exposing a surface of the transparent electrode surrounded by the insulator as the light extraction opening window for extracting a weak light and supposed to be the light extraction surface, and covering an entire circumference of an outer circumferential edge of the transparent electrode surrounded by the insulator; and
    a back electrode connected to the lower clad layer.

(Supplementary Description 3)

There is provided the light-emitting element of the supplementary description 2, wherein the groove is formed at a depth that reaches at least the lower clad layer from the surface side of the transparent electrode.

(Supplementary Description 4)

There is provided the light-emitting element of the supplementary description 2 or 3, wherein the opening has any one of the shapes of a circular shape, an elliptical shape, an oval shape, a rounded corner shape, a rectangular shape, and a combination of them.

(Supplementary Description 5)

There is provided the light-emitting element of any one of the supplementary descriptions 2 to 4, wherein the transparent electrode exposed from the opening covers an entire surface of the upper clad layer without exposing a surface of the upper clad layer.

(Supplementary Description 6)

There is provided the light-emitting element of any one of the supplementary descriptions 2 to 5, wherein a light shielding film covering an outside region of the insulator, is formed on a main surface of the light-emitting element at a side where the opening is formed.

(Supplementary Description 7)

There is provided the light-emitting element of the supplementary description 6, wherein the light shielding film has a metal film formed integrally with a metal film constituting the surface electrode.

(Supplementary Description 8)

A light source formed by disposing one or more light-emitting elements of any one of the supplementary descriptions 1 to 7, on the same plane.

(Supplementary Description 9)

An imaging device, having the light-emitting element of any one of the supplementary descriptions 1 to 7, as a reference light source.

(Supplementary Description 10)

A method for observing a luminous body, including:
    acquiring a total luminous flux light quantity and an emission angle distribution of a light emitted from the light extraction surface of the light-emitting element of any one of the supplementary descriptions 1 to 7;
    calibrating an imaging device using the light-emitting element whose total luminous flux light quantity and emission angle distribution are already acquired, as a reference light source; and
    photographing a light-emitting surface of a luminous body which is measurement object, and acquiring a total luminous flux light quantity of a weak light emitted from the luminous body, using the already calibrated imaging device.

(Supplementary Description 11)

The method for observing the luminous body of the supplementary description 10, wherein a dimension of the light-emitting surface of the luminous body is acquired by comparing an image obtained by photographing a light extraction surface of the light-emitting element, and an image obtained by photographing a light-emitting surface of the luminous body.

(Supplementary Description 12)

A reference light source, including:
- a light-emitting element having a characteristic that a brightness of a light-emitting surface is varied according to an operation temperature;
- a light-emitting element drive part configured to drive the light-emitting element;
- a temperature sensor configured to measure a temperature of the light-emitting element; and
- a controller connected to each of the light-emitting element drive part and the temperature sensor,
- wherein based on temperature information received from the temperature sensor, the controller is configured to vary a current value or a voltage value for driving the light-emitting element by the light-emitting element drive part, so as to suppress a variation of the brightness of the light-emitting surface of the light-emitting element caused by a variation of an environmental temperature.

(Supplementary Description 13)

The reference light source of the supplementary description 12, wherein the controller is configured to vary the current value by setting a correction coefficient based on the temperature information received from the temperature sensor, and multiplying a reference current value by the correction coefficient.

(Supplementary Description 14)

The reference light source of the supplementary description 12 or 13, wherein the temperature sensor is configured to repeat a measurement of the temperature of the light-emitting element at a prescribed frequency, and the controller is configured to vary a current value for driving the light-emitting element by the light-emitting element drive part, at least every time the temperature information received from the temperature sensor is varied.

(Supplementary Description 15)

The reference light source of any one of the supplementary descriptions 1 to 14, wherein the controller is configured to cause the light emitting element to generate a light emission with a prescribed average brightness of a light-emitting surface, by applying a lighting pulse width and frequency to the light-emitting element drive part, and controlling a lighting/light-out operation of the light-emitting element by the light-emitting element drive part.

(Supplementary Description 16)

The reference light source of the supplementary description 15 further including an operator for inputting a light quantity value, wherein the controller is configured to set the pulse width and the frequency, based on the light quantity value inputted by the operator.

(Supplementary Description 17)

The reference light source of the supplementary description 13, wherein the reference current value is the current value within a range of 100 μA to 500 μA.

(Supplementary Description 18)

The reference light source of any one of the supplementary descriptions 12 to 17, further including a neutral density filter for attenuating a light incident from the light-emitting element.

(Supplementary Description 19)

The reference light source of any one of the supplementary descriptions 1 to 7, wherein the light-emitting element includes a plurality of light-emitting elements having different luminescent colors, and based on the temperature information received from the temperature sensor, the controller is configured to vary a current value for driving the plurality of light-emitting elements having different luminescent colors by the light-emitting element drive part, so as to suppress a variation of a brightness of a light-emitting surface of each of the plurality of light-emitting elements having different luminescent colors caused by a variation of an environmental temperature.

(Supplementary Description 20)

The reference light source of any one of the supplementary descriptions 12 to 19, further including:
- a battery configured to supply power to the light-emitting element drive part, the temperature sensor, and the controller; and
- a case configured to integrally contain the light-emitting element, the light-emitting element drive part, the temperature sensor, the controller, and the battery.

(Supplementary Description 21)

The reference light source of any one of the supplementary descriptions 12 to 20, including the light-emitting element of the supplementary description 1 as the light-emitting element.

(Supplementary Description 22)

A reference light source, including:
- a light-emitting element having a characteristic that a brightness of a light-emitting surface is varied according to an operation temperature;
- a light-emitting element drive part configured to drive the light-emitting element;
- a temperature sensor configured to measure a temperature of the light-emitting element; and
- a controller connected to each of the light-emitting element drive part and the temperature sensor,
- wherein based on temperature information received from the temperature sensor, the controller is configured to vary at least one of a current value, a voltage value, and a pulse width and frequency of lighting for driving the light-emitting element by the light-emitting element drive part, so as to suppress a variation of a brightness of a light-emitting surface or an average brightness of the light-emitting surface of the light-emitting element caused by a variation of an environmental temperature.

(Supplementary Description 23)

A method for observing a luminous body, including:
- acquiring a total luminous flux light quantity and an emission angle distribution of a light emitted from a light-emitting surface of the reference light source of the supplementary description 12;
- calibrating an imaging device using the light-emitting element whose total luminous flux light quantity and emission angle distribution are already acquired, as a reference light source; and
- photographing a light-emitting surface of a luminous body which is a measurement object, and acquiring a total luminous flux light quantity of a weak light emitted from the luminous body, using the calibrated imaging device.

(Supplementary Description 24)

The method for observing a luminous body of the supplementary description 22, including acquiring a dimension of the light-emitting surface of the luminous body by comparing an image obtained by photographing a light-emitting surface of a reference light source of the supplementary description 12, and an image obtained by photographing the light-emitting surface of the luminous body.

DESCRIPTION OF SIGNS AND NUMERALS 1, 10L, 10R, 10G, 10B Light-emitting element
2 Lower clad layer
3 Light-emitting layer
5 Transparent electrode
6 Groove
7 Insulator
8 Surface electrode
8A Opening
10 Back electrode
12 Light extraction surface
20 Light-emitting element drive part
30 Temperature sensor
40 Controller
41 Operation setting part
42 Light quantity setting part
43 Drive parameter selection table
44 Light-emitting surface brightness (light quantity) correcting part
45 Correction coefficient selection table
50 Light emission part
51 Neutral density filter
60 Battery
70 Case
71 Display panel
72a to 72d Operation button (operation piece)
80 Light (emitted from the light emission part 50)

The invention claimed is:

1. A light-emitting element, in which a light whose emission angle distribution is one of Lambert's emission law or uniform Isotropic emission, is extracted from a light extraction opening window, and an in-plane distribution of a light intensity on a light extraction surface of the light extraction opening window is uniform, and which can be used as a reference light source when measuring an absolute light quantity of a weak light emitted from a luminous body which is a measurement object, the light-emitting element comprising:
a lower clad layer;
a light-emitting layer formed on the lower clad layer;
an upper clad layer formed on the light-emitting layer;
a transparent electrode formed on the upper clad layer;
a cylindrical insulator provided so as to embed a groove formed at a depth that reaches at least the light-emitting layer from a surface side of the transparent electrode;
a surface electrode formed on the transparent electrode, having an opening by exposing a surface of the transparent electrode surrounded by the insulator as the light extraction opening window for extracting a weak light and supposed to be the light extraction surface, and covering an entire circumference of an outer circumferential edge of the transparent electrode surrounded by the insulator; and
a back electrode connected to the lower clad layer.

2. The light-emitting element according to claim 1, wherein the groove is formed at a depth that reaches at least the lower clad layer from the surface side of the transparent electrode.

3. The light-emitting element according to claim 1, wherein the opening has any one of the shapes of a circular shape, an elliptical shape, an oval shape, a rounded corner shape, a rectangular shape, and a combination of them.

4. The light-emitting element according to claim 1, wherein the transparent electrode exposed from the opening covers an entire surface of the upper clad layer without exposing a surface of the upper clad layer.

5. The light-emitting element according to claim 1, wherein a light shielding film covering an outside region of the insulator, is formed on a main surface of the light-emitting element at a side where the opening is formed.

6. The light-emitting element according to claim 5, wherein the light shielding film has a metal film formed integrally with a metal film constituting the surface electrode.

7. A reference light source, comprising:
the light-emitting element of claim 1 having a characteristic that a brightness of a light-emitting surface is varied according to an operation temperature;
a light-emitting element drive part configured to drive the light-emitting element;
a temperature sensor configured to measure a temperature of the light-emitting element; and
a controller connected to each of the light-emitting element drive part and the temperature sensor,
wherein based on temperature information received from the temperature sensor, the controller is configured to vary a current value or a voltage value for driving the light-emitting element by the light-emitting element drive part, so as to suppress a variation of the brightness of the light-emitting surface of the light-emitting element caused by a variation of an environmental temperature.

8. The reference light source according to claim 7, wherein the controller is configured to vary the current value by setting a correction coefficient based on the temperature information received from the temperature sensor, and multiplying a reference current value by the correction coefficient.

9. The reference light source according to claim 8, wherein the reference current value is the current value within a range of 100 µA to 500 µA.

10. The reference light source according to claim 7, wherein the temperature sensor is configured to repeat a measurement of the temperature of the light-emitting element at a prescribed frequency, and the controller is configured to vary a current value for driving the light-emitting element by the light-emitting element drive part, every time the temperature information received from at least the temperature sensor, is varied.

11. The reference light source according to claim 7, wherein the controller is configured to cause the light emitting element to generate a light emission with a prescribed average brightness of a light-emitting surface, by applying a lighting pulse width and frequency to the light-emitting element drive part, and controlling a lighting/light-out operation of the light-emitting element by the light-emitting element drive part.

12. The reference light source according to claim 11, further comprising an operation piece for inputting a light quantity value, wherein the controller is configured to set the pulse width and the frequency, based on the light quantity value inputted by the operation piece.

13. The reference light source according to claim 7, further comprising a neutral density filter for attenuating a light incident from the light-emitting element.

14. The reference light source according to claim 7, wherein the light-emitting element comprises a plurality of light-emitting elements having different luminescent colors, and based on the temperature information received from the temperature sensor, the controller is configured to vary each current value for driving the plurality of light-emitting elements having different luminescent colors by the light-emitting element drive part, so as to suppress a brightness of a light-emitting surface of each of the plurality of light-emitting elements having different luminescent colors caused by a variation of an environmental temperature.

15. The reference light source according to claim 7, further comprising:
   a battery configured to supply power to the light-emitting element drive part, the temperature sensor, and the controller; and
   a case configured to integrally contain the light-emitting element, the light-emitting element drive part, the temperature sensor, the controller, and the battery.

16. A method for observing a luminous body, comprising:
   acquiring a total luminous flux light quantity and an emission angle distribution of a light emitted from a light-emitting surface of the reference light source of claim 1;
   calibrating an imaging device using the light-emitting element whose total luminous flux light quantity and emission angle distribution are already acquired as a reference light source; and
   photographing a light-emitting surface of a luminous body which is a measurement object, and acquiring a total luminous flux light quantity of a weak light emitted from the luminous body, using the calibrated imaging device.

* * * * *